(12) United States Patent
Harada et al.

(10) Patent No.: US 12,419,031 B2
(45) Date of Patent: Sep. 16, 2025

(54) SEMICONDUCTOR-ELEMENT-INCLUDING MEMORY DEVICE

(71) Applicant: Unisantis Electronics Singapore Pte. Ltd., Singapore (SG)

(72) Inventors: Nozomu Harada, Tokyo (JP); Masakazu Kakumu, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 432 days.

(21) Appl. No.: 18/176,680

(22) Filed: Mar. 1, 2023

(65) Prior Publication Data

US 2023/0284432 A1   Sep. 7, 2023

(30) Foreign Application Priority Data

Mar. 2, 2022  (WO) ................. PCT/JP2022/008865

(51) Int. Cl.
*H10B 12/00* (2023.01)
*H10D 30/69* (2025.01)

(52) U.S. Cl.
CPC ........... *H10B 12/20* (2023.02); *H10D 30/711* (2025.01)

(58) Field of Classification Search
CPC ....... H10B 12/20; H10B 20/20; H10D 30/711
See application file for complete search history.

(56) References Cited

U.S. PATENT DOCUMENTS

| 2003/0111681 | A1 | 6/2003 | Kawanaka |
| 2006/0157738 | A1 | 7/2006 | Kawanaka |
| 2008/0137394 | A1 | 6/2008 | Shimano et al. |
| 2019/0172828 | A1 | 6/2019 | Smith et al. |
| 2020/0135863 | A1 | 4/2020 | Han et al. |

(Continued)

FOREIGN PATENT DOCUMENTS

| JP | H02-188966 A | 7/1990 |
| JP | H03-171768 A | 7/1991 |

(Continued)

OTHER PUBLICATIONS

International Preliminary Report on Patentability in International Application No. PCT/JP2022/008865 dated Sep. 12, 2024 (6 pages).

(Continued)

*Primary Examiner* — Mohammad A Rahman
(74) *Attorney, Agent, or Firm* — Crowell & Moring LLP

(57) ABSTRACT

Si bodies 24*aa* to 24*ad*, 24*ba* to 24*bd*, and 45*a* to 45*d* are disposed parallel to a substrate 20 and are adjacent to each other in a horizontal direction at regular intervals. A HfO$_2$ layer 27*b* surrounds the Si bodies 24*aa* to 45*d*. TiN layers 34*a* to 34*d* surround the HfO$_2$ layer 27*b*, are isolated from each other, and are each formed of portions contiguous in the horizontal direction. The Si bodies 45*a* to 45*d* are formed stepwise in cross-sectional view in the terminating end in the horizontal direction. Metal wiring layers 52*a* to 52*d* are connected to the TiN layers 34*a* to 34*d* and extend up to above an insulating layer 50 through contact holes 51*a* to 51*d* extending in a vertical direction from the terminating ends of the TiN layers 34*a* to 34*d*. The metal wiring layers 52*a* to 52*d* are connected to word lines WL1 to WL4.

13 Claims, 13 Drawing Sheets

(56) References Cited

U.S. PATENT DOCUMENTS

2021/0028169 A1 1/2021 Smith et al.
2022/0028869 A1* 1/2022 Masuoka .............. H10B 10/12

FOREIGN PATENT DOCUMENTS

| JP | 2003-188279 A | 7/2003 |
|---|---|---|
| JP | 3957774 B2 | 8/2007 |
| JP | 2008-147514 A | 6/2008 |
| JP | 2021-504961 A | 2/2021 |
| JP | 2021-508414 A | 3/2021 |
| WO | WO 2019/108366 A1 | 6/2019 |

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's", IEEE Transaction on Electron Devices, vol. 38, No. 3, pp. 573-578 (Mar. 1991).
H. Chung, H. Kim, H. Kim, K. Kim, S. Kim, K. W.Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, Dec., pp. 2201-2227 (2010).
K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007), pp. 767-770.
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, vol. 62, No. 6, pp. 1-9 (Jun. 2015).
M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (May 2010).
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.
International Search Report and Written Opinion in Application No. PCT/JP2022/008865, dated May 24, 2022.

* cited by examiner

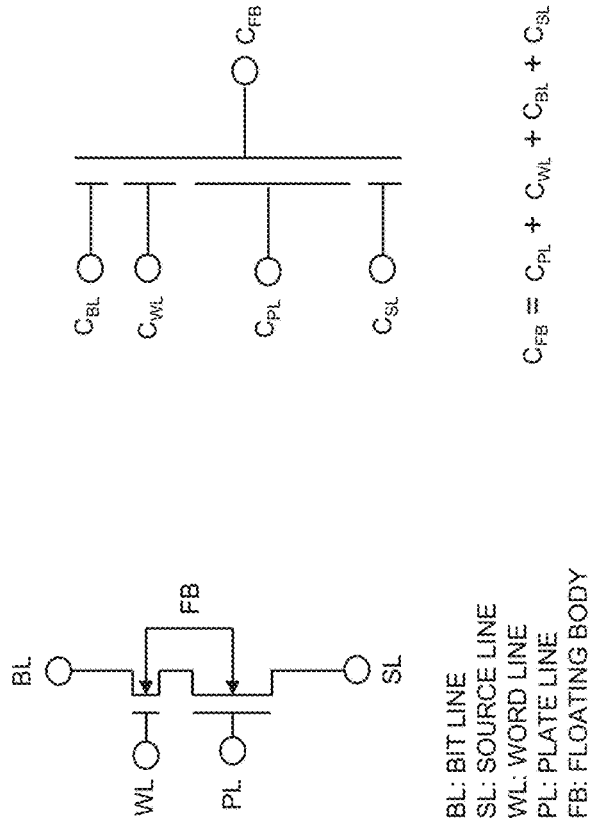
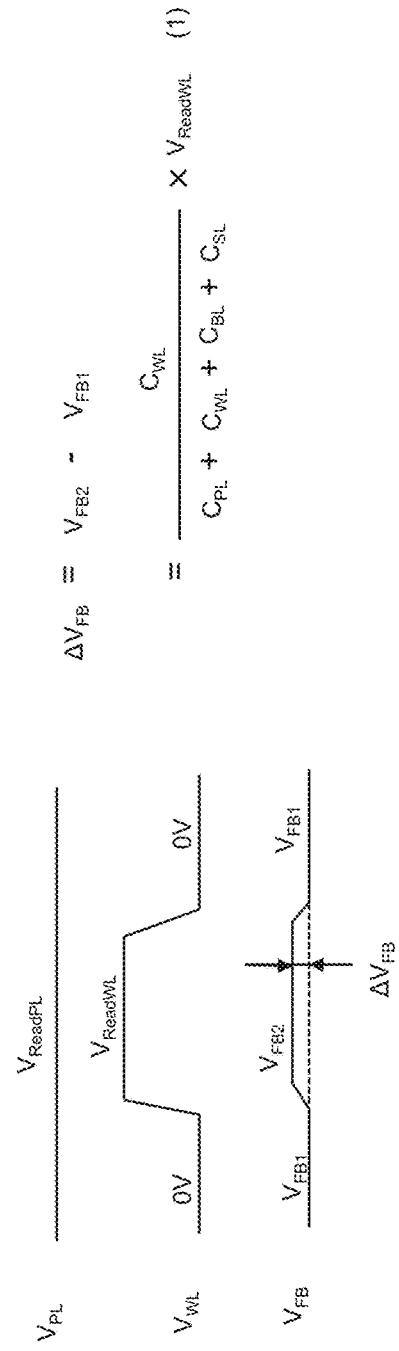
FIG. 4BA
FIG. 4BB
FIG. 4BC
BL: BIT LINE
SL: SOURCE LINE
WL: WORD LINE
PL: PLATE LINE
FB: FLOATING BODY
$$C_{FB} = C_{PL} + C_{WL} + C_{BL} + C_{SL}$$
$$\Delta V_{FB} = V_{FB2} - V_{FB1}$$
$$= \frac{C_{WL}}{C_{PL} + C_{WL} + C_{BL} + C_{SL}} \times V_{ReadWL} \quad (1)$$

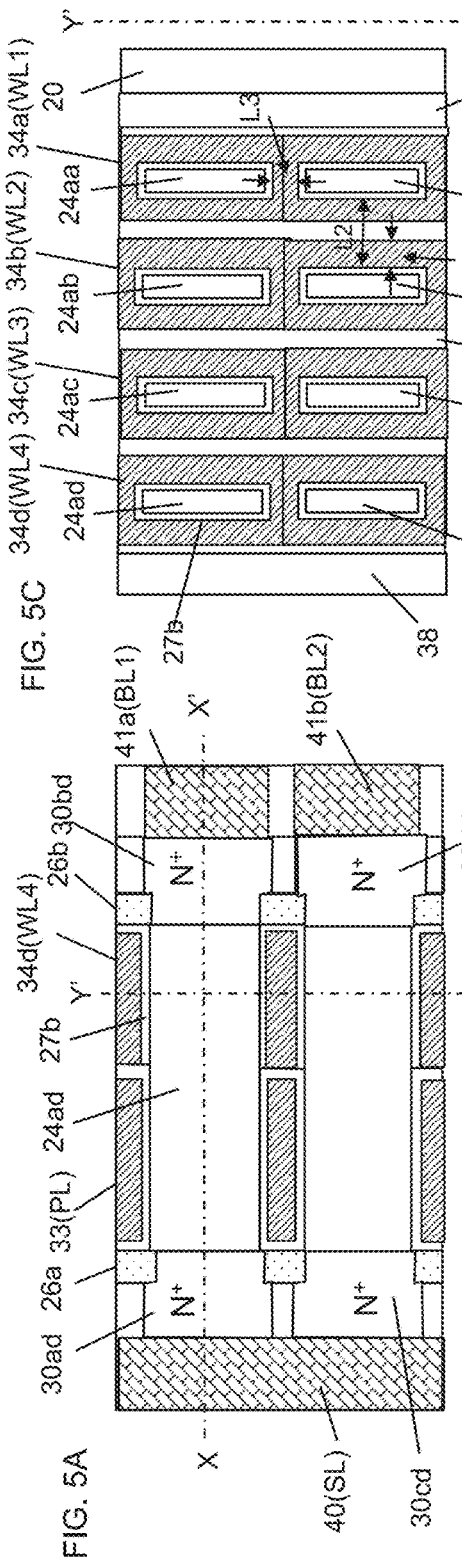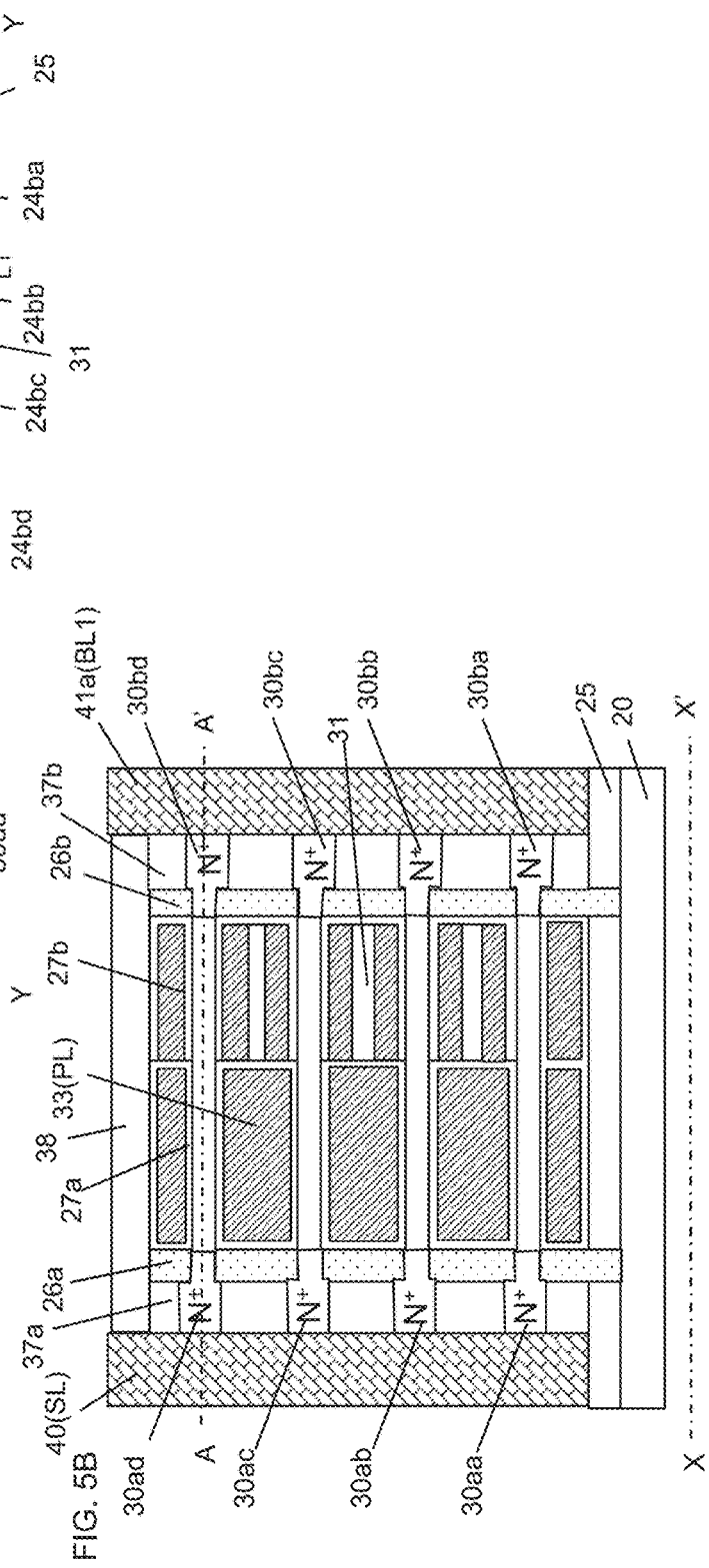

FIG. 10D $$C_{FB} = C_{WL} + C_{BL} + C_{SL} \quad \text{EXPRESSION (2)}$$

$$\Delta V_{FB} = V_{FB2} - V_{FB1}$$

$$= \frac{C_{WL}}{C_{WL} + C_{BL} + C_{SL}} \times V_{ProgWL} \quad \text{EXPRESSION (3)}$$

$$\beta = \frac{C_{WL}}{C_{WL} + C_{BL} + C_{SL}} \quad \text{EXPRESSION (4)}$$

SEMICONDUCTOR-ELEMENT-INCLUDING MEMORY DEVICE

CROSS-REFERENCE TO RELATED APPLICATIONS

This application claims priority to PCT/JP2022/008865, filed Mar. 2, 2022, the entire content of which is incorporated herein by reference.

BACKGROUND OF THE INVENTION

1. Field of the Invention

The present invention relates to a semiconductor-element-including memory device.

2. Description of the Related Art

Recently, there has been a demand for highly integrated and high-performance memory elements in the development of LSI (Large Scale Integration) technology.

Typical planar MOS transistors include a channel that extends in a horizontal direction along the upper surface of the semiconductor substrate. In contrast, SGTs include a channel that extends in a direction perpendicular to the upper surface of the semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Accordingly, the density of semiconductor devices can be made higher with SGTs than with planar MOS transistors. Such SGTs can be used as selection transistors to implement highly integrated memories, such as a DRAM (Dynamic Random Access Memory, see, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected, a PCM (Phase Change Memory, see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance change element is connected, an RRAM (Resistive Random Access Memory, see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007)), and an MRAM (Magneto-resistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the orientation of a magnetic spin with a current. Further, there exists, for example, a DRAM memory cell (see M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)) constituted by a single MOS transistor and including no capacitor. The present application relates to a dynamic flash memory that can be constituted only by a MOS transistor and that includes no resistance change element or capacitor.

Figures 10A, 10B, 10C, 10D:
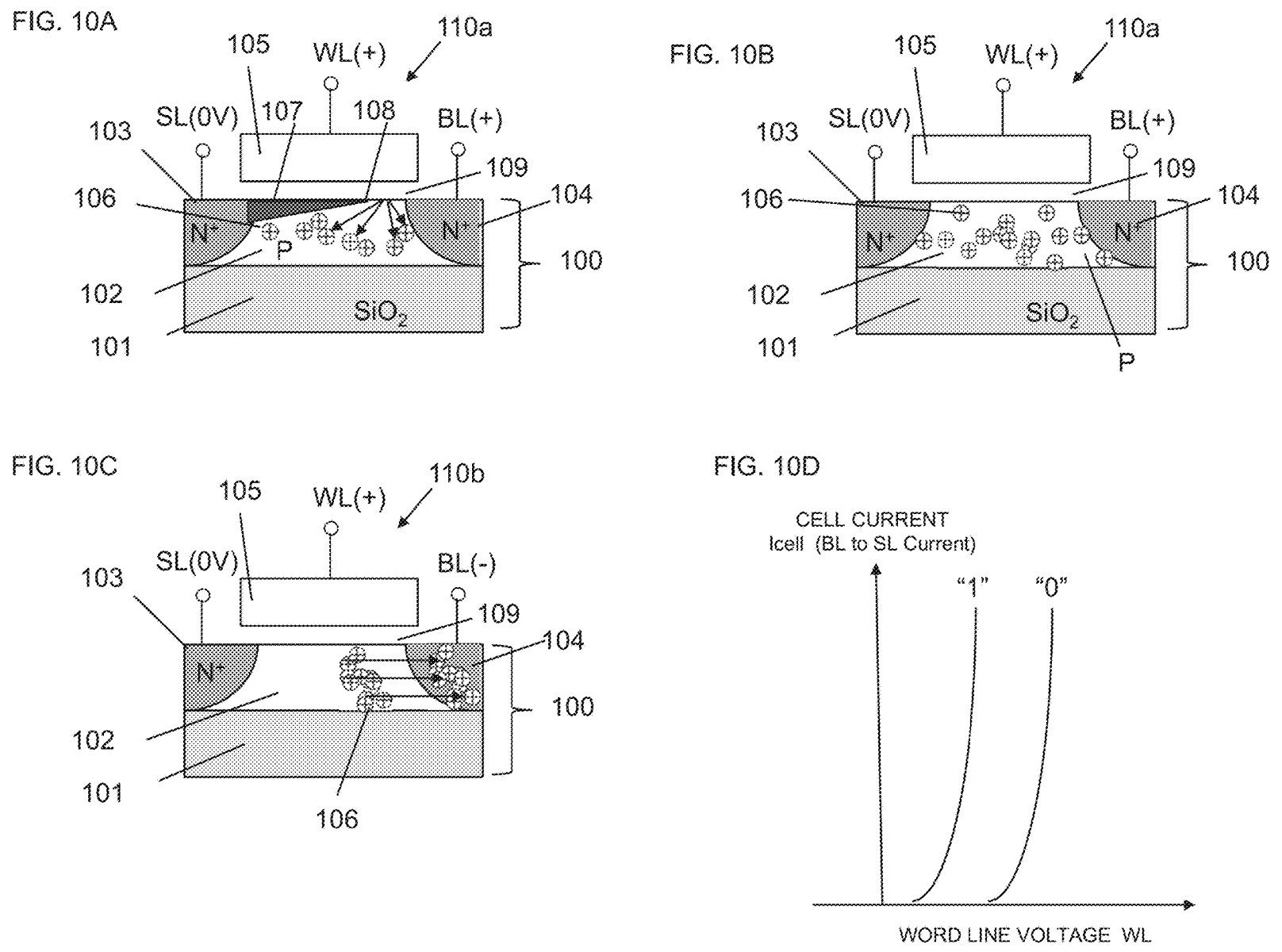

FIGS. 10A to 10D illustrate a write operation of a DRAM memory cell constituted by a single MOS transistor and including no capacitor described above, FIGS. 11A and 11B illustrate a problem in the operation, and FIGS. 12A to 12C illustrate a read operation.

FIGS. 10A to 10D illustrate a write operation of a DRAM memory cell. FIG. 10A illustrates a "1" write state. Here, the memory cell is formed on an SOI substrate 100, is constituted by a source N$^+$ layer 103 (hereinafter, a semiconductor region that contains a donor impurity in high concentrations is referred to as "N$^+$ layer") to which a source line SL is connected, a drain N$^+$ layer 104 to which a bit line BL is connected, a gate conductor layer 105 to which a word line WL is connected, and a floating body 102 of a MOS transistor 110a, and includes no capacitor. The single MOS transistor 110a constitutes the DRAM memory cell. Directly under the floating body 102, a SiO$_2$ layer 101 of the SOI substrate is in contact with the floating body 102. To write "1" to the memory cell constituted by the single MOS transistor 110a, the MOS transistor 110a is operated in the saturation region. That is, a channel 107, for electrons, extending from the source N$^+$ layer 103 has a pinch-off point 108 and does not reach the drain N$^+$ layer 104 to which the bit line is connected. When a high voltage is applied to both the bit line BL connected to the drain N$^+$ layer 104 and the word line WL connected to the gate conductor layer 105, and the MOS transistor 110a is operated at the gate voltage that is about one-half of the drain voltage, the electric field intensity becomes maximum at the pinch-off point 108 that is in the vicinity of the drain N$^+$ layer 104. As a result, accelerated electrons that flow from the source N$^+$ layer 103 toward the drain N$^+$ layer 104 collide with the Si lattice, and with kinetic energy lost at the time of collision, electron-positive hole pairs are generated (impact ionization phenomenon). Most of the generated electrons (not illustrated) reach the drain N$^+$ layer 104. Further, a very small proportion of the electrons that are very hot pass through a gate oxide film 109 and reach the gate conductor layer 105. With positive holes 106 that are simultaneously generated, the floating body 102 is charged. In this case, the generated positive holes contribute to an increase in the majority carriers because the floating body 102 is P-type Si. When the floating body 102 is filled with the generated positive holes 106 and the voltage of the floating body 102 becomes higher than that of the source N$^+$ layer 103 by Vb or more, further generated positive holes are discharged to the source N$^+$ layer 103. Here, Vb is the built-in voltage of the PN junction between the source N$^+$ layer 103 and the P layer, namely, the floating body 102, and is equal to about 0.7 V. FIG. 10B illustrates a state in which the floating body 102 is charged to saturation with the generated positive holes 106.

Now, a "0" write operation of a memory cell 110b will be described with reference to FIG. 10C. For the common selection word line WL, the memory cell 110a to which "1" is written and the memory cell 110b to which "0" is written are present at random. FIG. 10C illustrates a state of rewriting from the "1" write state to a "0" write state. To write "0", the voltage of the bit line BL is set to a negative bias, and the PN junction between the drain N$^+$ layer 104 and the P layer, namely, the floating body 102, is forward biased. As a result, the positive holes 106 in the floating body 102 generated in advance in the previous cycle flow into the drain N$^+$ layer 104 that is connected to the bit line BL. When the write operation ends, the two memory cells are in a state in which the memory cell 110a (FIG. 10B) is filled with the generated positive holes 106, and from the memory cell 110b (FIG. 10C), the generated positive holes are discharged. The potential of the floating body 102 of the memory cell 110a filled with the positive holes 106 becomes higher than that of the floating body 102 in which generated positive holes are not present. Therefore, the threshold voltage of the memory cell 110a becomes lower than the threshold voltage of the memory cell 110b. This is illustrated in FIG. 10D.

Now, a problem in the operation of the memory cell constituted by the single MOS transistor will be described with reference to FIGS. 11A and 11B. As illustrated in FIG. 11A, the capacitance $C_{FB}$ of the floating body 102 is equal to the sum of the capacitance $C_{WL}$ between the gate to which the word line is connected and the floating body 102, the junction capacitance $C_{SL}$ of the PN junction between the source N$^+$ layer 103 to which the source line is connected and the floating body 102, and the junction capacitance $C_{BL}$ of the PN junction between the drain N$^+$ layer 104 to which the bit line is connected and the floating body 102 and is expressed as follows.

$$C_{FB}=C_{WL}+C_{BL}+C_{SL} \quad (2)$$

Therefore, a change in the word line voltage $V_{WL}$ at the time of writing affects the voltage of the floating body 102 that functions as a storage node (contact point) of the memory cell. This is illustrated in FIG. 11B. When the word line voltage $V_{WL}$ rises from 0 V to $V_{progWL}$ at the time of writing, the voltage $V_{FB}$ of the floating body 102 rises from $V_{FB1}$, which is the voltage in the initial state before the word line voltage changes, to $V_{FB2}$ due to capacitive coupling with the word line. The voltage change amount $\Delta V_{FB}$ is expressed as follows.

$$\Delta V_{FB}=V_{FB2}-V_{FB1}=C_{WL}/(C_{WL}+C_{BL}+C_{SL})\times V_{ProgWL} \quad (3)$$

Here, $C_{WL}/(C_{WL}+C_{BL}+C_{SL})$ is expressed as follows.

$$\beta=C_{WL}/(C_{WL}+C_{BL}+C_{SL}) \quad (4)$$

β is called a coupling ratio. In this memory cell, the contribution ratio of $C_{WL}$ is large and, for example, $C_{WL}:C_{BL}:C_{SL}=8:1:1$ holds. This results in β=0.8. When the word line changes, for example, from 5 V at the time of writing to 0 V after the end of writing, the floating body 102 receives an amplitude noise of 5V×β=4 V due to capacitive coupling between the word line and the floating body 102. Accordingly, a sufficient margin is not provided to the potential difference between the "1" potential and the "0" potential of the floating body at the time of writing, which has been a problem.

FIGS. 12A to 12C illustrate a read operation. FIG. 12A illustrates a "1" write state and FIG. 12B illustrates a "0" write state. In actuality, however, even when Vb is set for the floating body 102 to write "1", once the word line returns to 0 V at the end of writing, the floating body 102 is lowered to a negative bias. When "0" is written, the floating body 102 is lowered to a further negative bias, and it is difficult to provide a sufficiently large margin to the potential difference between "1" and "0" at the time of writing as illustrated in FIG. 12C. This small operation margin has been a major problem of this DRAM memory cell. In addition, a high density needs to be attained in the DRAM memory cell.

SUMMARY OF THE INVENTION

In capacitor-less single-transistor DRAMs (gain cells) in an SGT-including memory device, capacitive coupling between the word line and the SGT body in a floating state is strong. When the potential of the word line is changed at the time of data reading or at the time of data writing, the change is directly transmitted as noise to the SGT body, which has been a problem. This causes a problem of erroneous reading or erroneous rewriting of storage data and makes it difficult to commercially introduce capacitor-less single-transistor DRAMs (gain cells). The above-described problems need to be solved, and further, high-performance and high-density DRAM memory cells need to be attained.

To solve the above-described problems, a semiconductor-element-including memory device according to the present invention includes:

a first semiconductor body that extends parallel to and in a horizontal direction relative to a substrate;

a second semiconductor body that is spaced apart from and above the first semiconductor body in a vertical direction relative to the substrate and that overlaps the first semiconductor body in plan view;

a first impurity region and a second impurity region that are connected to respective ends of the first semiconductor body;

a third impurity region and a fourth impurity region that are connected to respective ends of the second semiconductor body;

a gate insulating layer that covers the first semiconductor body and the second semiconductor body;

a first gate conductor layer and a second gate conductor layer that surround the gate insulating layer covering the first semiconductor body and that are adjacent to each other;

a third gate conductor layer and a fourth gate conductor layer that surround the gate insulating layer covering the second semiconductor body and that respectively overlap the first gate conductor layer and the second gate conductor layer in plan view;

a third semiconductor body that is on a level with the first semiconductor body in the vertical direction, is adjacent to the first semiconductor body in the horizontal direction, is surrounded by the second gate conductor layer extending in the horizontal direction, and is disposed, in plan view, in a direction perpendicular to a direction in which the first impurity region and the second impurity region are laid;

a fourth semiconductor body that is on a level with the second semiconductor body in the vertical direction, is adjacent to the second semiconductor body in the horizontal direction, is surrounded by the fourth gate conductor layer extending in the horizontal direction, is disposed, in plan view, in a direction perpendicular to a direction in which the third impurity region and the fourth impurity region are laid, and is shorter than a length of the third semiconductor body in the horizontal direction;

a first contact hole that extends upward from a portion of the second gate conductor layer surrounding a projecting portion of the third semiconductor body, the projecting portion being located farther outward than the fourth semiconductor body in plan view;

a second contact hole that extends upward from the fourth gate conductor layer surrounding the fourth semiconductor body;

a first conductor wiring layer that extends through the first contact hole and is connected to the second gate conductor layer; and a second conductor wiring layer that extends through the second contact hole and is connected to the fourth gate conductor layer (first invention).

In the first invention described above, the second gate conductor layer and the fourth gate conductor layer have identical thicknesses, and in the vertical direction relative to the substrate, a first length equal to two times the thickness of the second gate conductor layer is shorter than a second length between the gate insulating layers covering the first semiconductor body and the second semiconductor body, and in the horizontal direction relative to the substrate, the first length is longer than a third length that is a distance between the gate insulating layers surrounding the first semiconductor body and the third semiconductor body facing each other (second invention).

In the first invention described above, the first gate conductor layer and the third gate conductor layer have identical thicknesses, and in the vertical direction relative to the substrate, a first length equal to two times the thickness of the first gate conductor layer is shorter than a second length between the gate insulating layers covering the first semiconductor body and the second semiconductor body, and in the horizontal direction relative to the substrate, the first length is longer than a third length that is a distance between the gate insulating layers surrounding the first semiconductor body and the third semiconductor body facing each other (third invention).

In the first invention described above, the first gate conductor layer and the third gate conductor layer are contiguous in the vertical direction (fourth invention).

In the first invention described above, the first gate conductor layer and the third gate conductor layer are spaced apart from each other in the vertical direction, and the semiconductor-element-including memory device further includes:

a fifth semiconductor body that is on a level with the first semiconductor body in the vertical direction, is adjacent to the first semiconductor body in the horizontal direction, and is surrounded by the first gate conductor layer extending in the horizontal direction;

a sixth semiconductor body that is on a level with the third semiconductor body in the vertical direction, is adjacent to the third semiconductor body in the horizontal direction, is surrounded by the third gate conductor layer extending in the horizontal direction, and is shorter than a length of the fifth semiconductor body in the horizontal direction;

a third contact hole that extends upward from a portion of the first gate conductor layer surrounding a projecting portion of the fifth semiconductor body, the projecting portion being located farther outward than the sixth semiconductor body in plan view;

a fourth contact hole that extends upward from the third gate conductor layer surrounding the sixth semiconductor body;

a third conductor wiring layer that extends through the third contact hole and is connected to the first gate conductor layer; and a fourth conductor wiring layer that extends through the fourth contact hole and is connected to the third gate conductor layer (fifth invention).

In the first invention described above, the first impurity region and the third impurity region are electrically connected to each other, and the second impurity region and the fourth impurity region are electrically connected to each other (sixth invention).

In the first invention described above, the first impurity region and the third impurity region are electrically isolated from each other, and the second impurity region and the fourth impurity region are electrically connected to each other (seventh invention).

In the first invention described above, the semiconductor-element-including memory device includes:

a first memory cell that is formed of the first impurity region, the second impurity region, the first semiconductor body, the gate insulating layer, the first gate conductor layer, and the second gate conductor layer;

a second memory cell that has a structure identical to a structure of the first memory cell, is disposed in a direction in which the first impurity region and the second impurity region are laid, and is adjacent to the first impurity region, the first impurity region functioning as an impurity layer connected to a source line of the second memory cell; and a third memory cell that has a structure identical to the structure of the first memory cell, is disposed in the direction in which the first impurity region and the second impurity region are laid, and is adjacent to the second impurity region, the second impurity region functioning as an impurity layer connected to a bit line of the third memory cell (eighth invention).

In the first invention described above, voltages applied to the first impurity region, the second impurity region, the third impurity region, the fourth impurity region, the first gate conductor layer, the second gate conductor layer, the third gate conductor layer, and the fourth gate length are controlled to perform a memory write operation in which, of a group of electrons and a group of positive holes generated by an impact ionization phenomenon caused by a current that flows through the first semiconductor body and the second semiconductor body or by a gate-induced drain leakage current, the group of electrons or the group of positive holes that are majority carriers are retained in the first semiconductor body and the second semiconductor body, and perform a memory erase operation in which the group of electrons or the group of positive holes that are majority carriers are discharged from the first semiconductor body and the second semiconductor body (ninth invention).

In the first invention described above, each of the first gate conductor layer and the third gate conductor layer is divided into a plurality of gate conductor layers, in the horizontal direction, having identical shapes in plan view, and the divided gate conductor layers are driven synchronously or asynchronously (tenth invention).

In the first invention described above, each of the second gate conductor layer and the fourth gate conductor layer is divided into a plurality of gate conductor layers, in the horizontal direction, having identical shapes in plan view, and the divided gate conductor layers are driven synchronously or asynchronously (eleventh invention).

In the first invention described above, the first gate conductor layer and the third gate conductor layer are separately disposed on respective side surfaces of the first semiconductor body and are driven synchronously or asynchronously (twelfth invention).

In the first invention described above, the second gate conductor layer and the fourth gate conductor layer are separately disposed on respective side surfaces of the first semiconductor body and are driven synchronously or asynchronously (thirteenth invention).

BRIEF DESCRIPTION OF THE DRAWINGS

FIGS. 4BA, 4BB, and 4BC are diagrams for explaining the mechanism of the read operation of the SGT-including memory cell according to the first embodiment;

FIGS. 5A, 5B, and 5C are structural diagrams of an SGT-including memory device according to the first embodiment;

FIGS. 10A, 10B, 10C, and 10D are diagrams illustrating a write operation of a DRAM memory cell including no capacitor in the related art;

DESCRIPTION OF THE PREFERRED EMBODIMENTS

Hereinafter, the structure and driving system of a semiconductor-element-including memory device (hereinafter called a dynamic flash memory) according to the present invention will be described with reference to the drawings.

First Embodiment

The structure and mechanisms of operations of a dynamic flash memory cell according to a first embodiment of the present invention will be described with reference to FIG. 1 to FIGS. 4BA, 4BB, and 4BC. The structure of the dynamic flash memory cell will be described with reference to FIG. 1. A data erase mechanism will be described with reference to FIGS. 2A to 2C, a data write mechanism will be described with reference to FIGS. 3A to 3C, and a data read mechanism will be described with reference to FIGS. 4AA to 4AC and FIGS. 4BA to 4BC. The structure of the dynamic flash memory will be described with reference to FIGS. 5A to 5C, FIG. 6, and FIG. 7.

Figure 1:
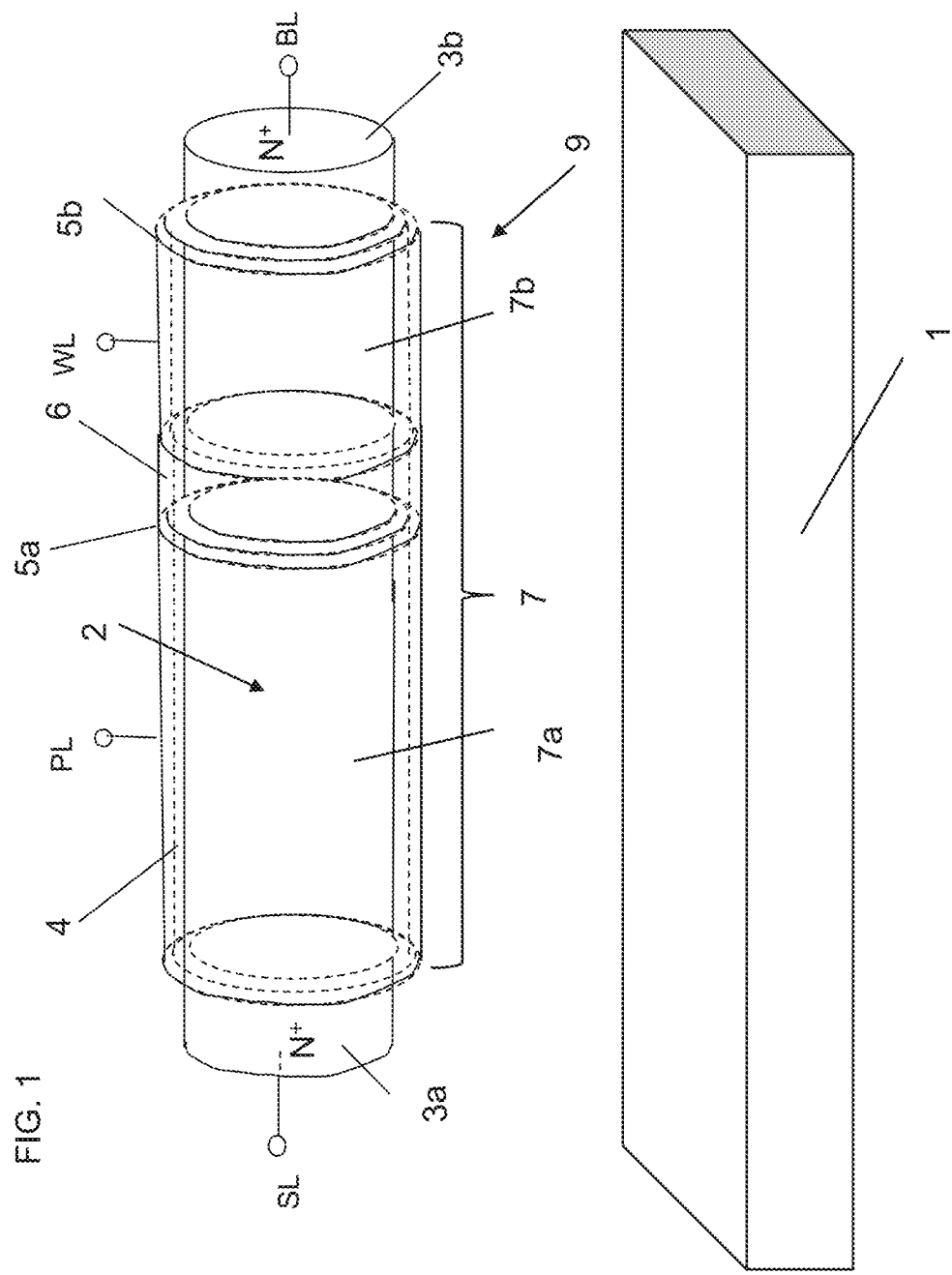
FIG. 1 is a structural diagram of an SGT-including memory cell according to a first embodiment.

FIG. 1 illustrates the structure of the dynamic flash memory cell according to the first embodiment of the present invention. An N$^+$ layer 3a (which is an example of "first impurity region" in the claims) is disposed parallel to a substrate 1 (which is an example of "substrate" in the claims). To the N$^+$ layer 3a, a silicon semiconductor body 2 (which is an example of "first semiconductor body" in the claims) (hereinafter, the silicon semiconductor body is referred to as "Si body") is connected. To the Si body 2, an N$^+$ layer 3b (which is an example of "second impurity region" in the claims) is connected. The Si body 2 between the N$^+$ layers 3a and 3b functions as a channel region 7. A gate insulating layer 4 surrounds the Si body 2. A first gate conductor layer 5a (which is an example of "first gate conductor layer" in the claims) and a second gate conductor layer 5b (which is an example of "second gate conductor layer" in the claims) adjacent to the first gate conductor layer 5a surround the gate insulating layer 4. The first gate conductor layer 5a and the second gate conductor layer 5b are isolated from each other by an insulating layer 6. Accordingly, a dynamic flash memory cell 9 constituted by the N$^+$ layers 3a and 3b, a first channel region 7a, a second channel region 7b, the gate insulating layer 4, the first gate conductor layer 5a, and the second gate conductor layer 5b is formed. A large number of dynamic flash memory cells 9 are arranged on the substrate 1 to form a dynamic flash memory device.

The N$^+$ layer 3a is connected to a source line SL (which is an example of "source line" in the claims), the N$^+$ layer 3b is connected to a bit line BL (which is an example of "bit line" in the claims), the first gate conductor layer 5a is connected to a plate line PL, and the second gate conductor layer 5b is connected to a word line WL. Note that the N$^+$ layer 3a may be connected to the bit line BL and the N$^+$ layer 3b may be connected to the source line SL.

Desirably, the dynamic flash memory cell has a structure in which the gate capacitance of the first gate conductor layer 5a connected to the plate line PL is larger than the gate capacitance of the second gate conductor layer 5b connected to the word line WL. The first gate conductor layer 5a connected to the plate line PL may be divided into two gate conductor layers, and the gate length of each of the two divided gate conductor layers may be made equal to the gate length of the second gate conductor layer 5b. In this case, the two divided gate conductor layers may be disposed on the respective sides of the second gate conductor layer.

Further, the second gate conductor layer 5b may be divided into two gate conductor layers in the horizontal direction, and the two divided gate conductor layers may be disposed on the respective sides of the first gate conductor layer 5a.

Further, the first gate conductor layer 5a may be divided into two or more gate conductor layers in the horizontal direction, and the gate conductor layers may be operated synchronously or asynchronously. Similarly, the second gate conductor layer 5b may be divided into two or more gate conductor layers in the horizontal direction, and the gate conductor layers may be operated synchronously or asynchronously. In this case, the operations of the dynamic flash memory can also be performed.

Either the first gate conductor layer 5a or the second gate conductor layer 5b or both the first gate conductor layer 5a and the second gate conductor layer 5b may be formed on both side surfaces of the Si body 2 separately.

In FIG. 1, to make the gate capacitance of the first gate conductor layer 5a connected to the plate line PL larger than the gate capacitance of the second gate conductor layer 5b to which the word line WL is connected, the gate length of the first gate conductor layer 5a in the horizontal direction is made longer than the gate length of the second gate conductor layer 5b. Alternatively, instead of making the gate length of the first gate conductor layer 5a longer than the gate length of the second gate conductor layer 5b, the thickness of a portion of the gate insulating layer 4 surrounded by the first gate conductor layer 5a may be made thinner than the thickness of a portion of the gate insulating layer 4 surrounded by the second gate conductor layer 5b. Alternatively, the dielectric constant of the portion of the gate insulating layer 4 surrounded by the first gate conductor layer 5a may be made higher than the dielectric constant of the portion of the gate insulating layer 4 surrounded by the second gate conductor layer 5b. The gate capacitance of the first gate conductor layer 5a may be made larger than the gate capacitance of the second gate conductor layer 5b, by a combination of any of the lengths of the gate conductor layers 5a and 5b and the thicknesses and dielectric constants of the portions of the gate insulating layer 4.

Figure 2C:
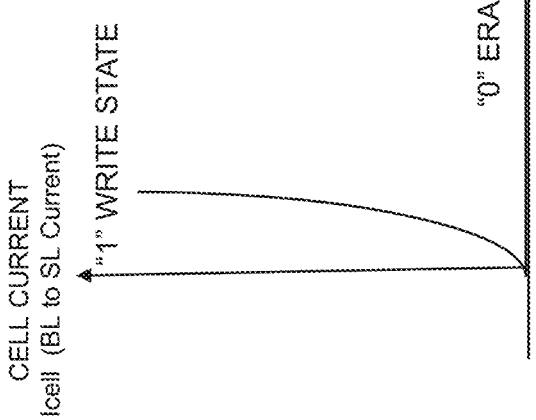
FIGS. 2A, 2B, and 2C are diagrams for explaining a mechanism of an erase operation of the SGT-including memory cell according to the first embodiment.
Figure 2A:
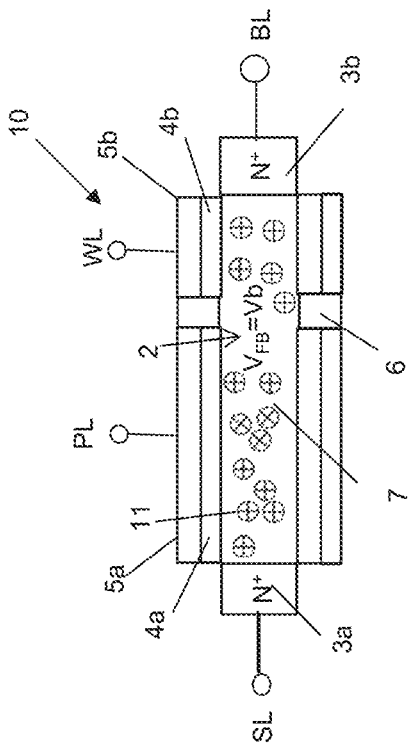
Figure 2B:
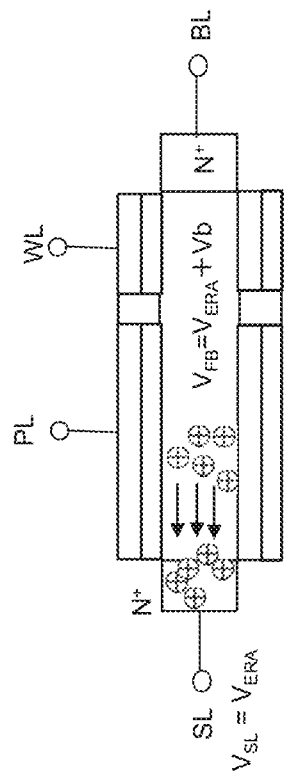

A mechanism of an erase operation of the dynamic flash memory cell according to the first embodiment will be described with reference to FIGS. 2A to 2C. The channel region 7 between the N+ layers 3a and 3b is electrically isolated from the substrate 1 and functions as a floating body. FIG. 2A illustrates a state before the erase operation, in which a group of positive holes 11 generated by impact ionization in the previous cycle are stored in the channel region 7. As illustrated in FIG. 2B, at the time of the erase operation, the voltage of the source line SL is set to a negative voltage $V_{ERA}$. Here, $V_{ERA}$ is equal to, for example, −3 V. As a result, regardless of the value of the initial potential of the channel region 7, the PN junction between the N+ layer 3a to which the source line SL is connected and which functions as the source and the channel region 7 is forward biased. As a result, the group of positive holes 11 generated by impact ionization in the previous cycle and stored in the channel region 7 are drawn into the N+ layer 3a that functions as the source, and the potential $V_{FB}$ of the channel region 7 becomes equal to $V_{FB}=V_{ERA}+Vb$. Here, Vb is the built-in voltage of the PN junction and is equal to about 0.7 V. Therefore, in a case of $V_{ERA}=-3$ V, the potential of the channel region 7 is equal to −2.3 V. This value indicates the potential state of the channel region 7 in an erase state. Therefore, when the potential of the channel region 7 that is a floating body becomes a negative voltage, the threshold voltage of the N-channel MOS transistor of the dynamic flash memory cell 9 increases due to a substrate bias effect. Therefore, when the voltage applied to the first gate conductor layer 5a connected to the plate line PL is set to, for example, the threshold voltage or lower, a first N-channel MOS transistor closer to the plate line PL becomes non-conducting and a memory cell current does not flow therethrough. Accordingly, as illustrated in FIG. 2C, the erase state in which a memory cell current does not flow even when a high voltage is applied to the second gate conductor layer 5b connected to the word line WL is attained, and this state corresponds to logical storage data "0". Note that the conditions of voltages applied to the bit line BL, the source line SL, the word line WL, and the plate line PL and the potential of the floating body described above are examples for performing the erase operation, and other operation conditions based on which the erase operation can be performed may be employed.

Figure 3C:
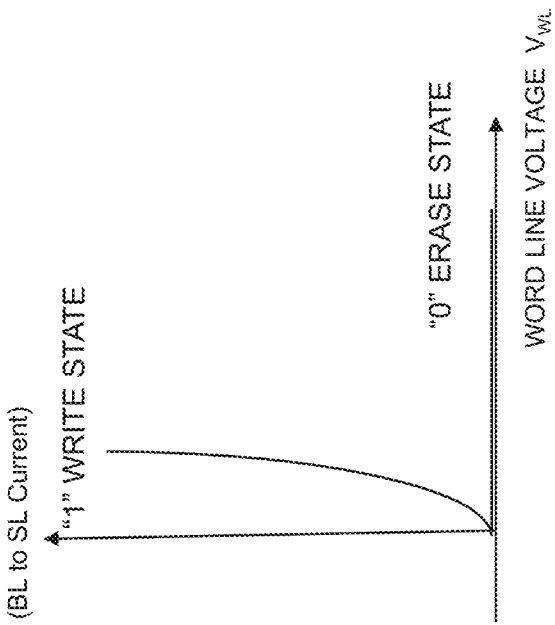
FIGS. 3A, 3B, and 3C are diagrams for explaining a mechanism of a write operation of the SGT-including memory cell according to the first embodiment.
Figure 3A:
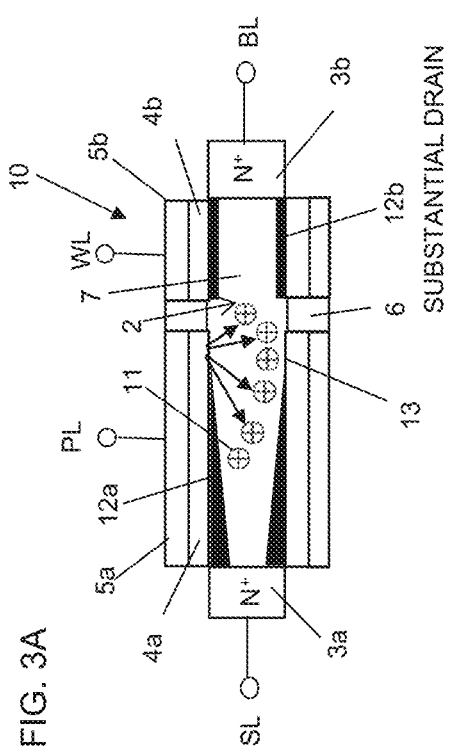
Figure 3B:
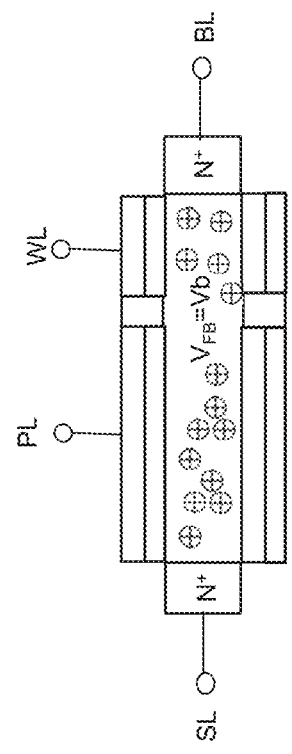

FIGS. 3A to 3C illustrate a write operation of the dynamic flash memory cell according to the first embodiment of the present invention. As illustrated in FIG. 3A, for example, 0 V is applied to the N+ layer 3a to which the source line SL is connected, for example, 3 V is applied to the N+ layer 3b to which the bit line BL is connected, for example, 2 V is applied to the first gate conductor layer 5a to which the plate line PL is connected, and, for example, 5 V is applied to the second gate conductor layer 5b to which the word line WL is connected. As a result, as illustrated in FIG. 3A, an inversion layer 12a is formed in the channel region 7 on the inner side of the first gate conductor layer 5a to which the plate line PL is connected, and the first N-channel MOS transistor including the first gate conductor layer 5a is operated in the saturation region. As a result, in the inversion layer 12a on the inner side of the first gate conductor layer 5a to which the plate line PL is connected, a pinch-off point 13 is present. In contrast, a second N-channel MOS transistor including the second gate conductor layer 5b to which the word line WL is connected is operated in the linear region. As a result, an inversion layer 12b in which a pinch-off point is not present is formed on the entire inner side of the second gate conductor layer 5b to which the word line WL is connected. The inversion layer 12b that is formed on the entire inner side of the second gate conductor layer 5b to which the word line WL is connected substantially functions as the drain of the first N-channel MOS transistor including the first gate conductor layer 5a. As a result, the electric field becomes maximum in a first boundary region of the channel region 7 between the first N-channel MOS transistor including the first gate conductor layer 5a and the second N-channel MOS transistor including the second gate conductor layer 5b that are connected in series, and an impact ionization phenomenon occurs in this region. This region is a source-side region when viewed from the second N-channel MOS transistor including the second gate conductor layer 5b to which the word line WL is connected, and therefore, this phenomenon is called a source-side impact ionization phenomenon. By this source-side impact ionization phenomenon, electrons flow from the N+ layer 3a to which the source line SL is connected toward the N+ layer 3b to which the bit line BL is connected. The accelerated electrons collide with lattice Si atoms, and electron-positive hole pairs are generated by the kinetic energy. Although some of the generated electrons flow into the first gate conductor layer 5a and the second gate conductor layer 5b, most of the generated electrons flow into the N+ layer 3b to which the bit line BL is connected. At the time of "1" writing, electron-positive hole pairs may be generated by using a gate-induced drain leakage (GIDL) current, and the floating body FB may be filled with the generated group of positive holes (see E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-697, April 2006).

As illustrated in FIG. 3B, the generated group of positive holes 11 are majority carriers in the channel region 7, with which the channel region 7 is charged to a positive bias. To the N+ layer 3a to which the source line SL is connected, 0 V is applied, and therefore, the channel region 7 is charged up to the built-in voltage Vb (about 0.7 V) of the PN junction between the N+ layer 3a to which the source line SL is connected and the channel region 7. When the channel region 7 is charged to a positive bias, the threshold voltages of the first N-channel MOS transistor and the second N-channel MOS transistor decrease due to a substrate bias effect. Accordingly, as illustrated in FIG. 3C, the threshold voltage of the second N-channel MOS transistor to which the word line WL is connected decreases. This write state of the channel region 7 is assigned to logical storage data "1".

At the time of the write operation, electron-positive hole pairs may be generated by an impact ionization phenomenon or by a GIDL current in a second boundary region between the N+ layer 3a and the channel region 7 or in a third boundary region between the N+ layer 3b and the channel region 7 instead of the first boundary region described above, and the channel region 7 may be charged with the generated group of positive holes 11. Note that the conditions of voltages applied to the bit line BL, the source line SL, the word line WL, and the plate line PL described above are examples for performing the write operation, and other operation conditions based on which the write operation can be performed may be employed.

Figure 4A:
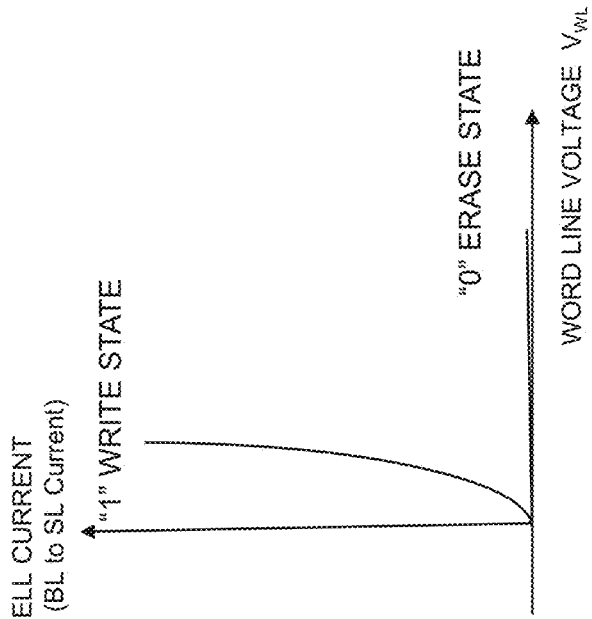
FIGS. 4AA, 4AB, and 4AC are diagrams for explaining a mechanism of a read operation of the SGT-including memory cell according to the first embodiment.
Figure 4A:
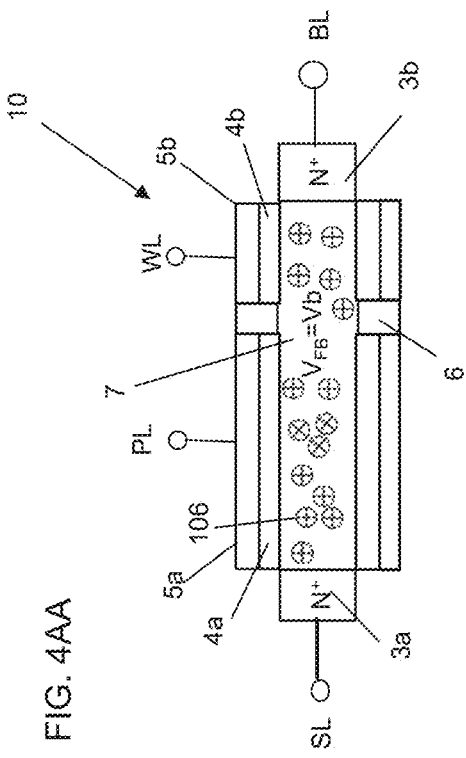
Figure 4A:
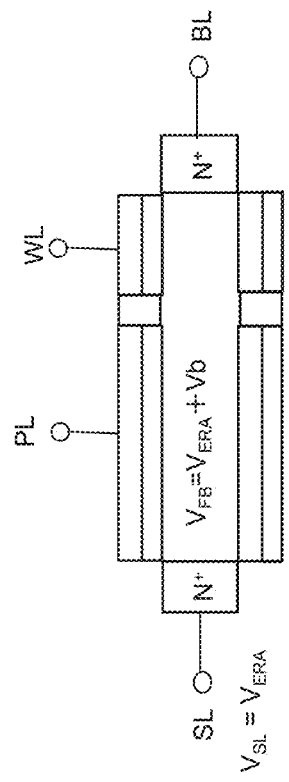

A read operation of the dynamic flash memory cell according to the first embodiment of the present invention will be described with reference to FIGS. 4AA to 4AC and FIGS. 4BA to 4BC. The read operation of the dynamic flash memory cell will be described with reference to FIGS. 4AA to 4AC. As illustrated in FIG. 4AA, when the channel region 7 is charged up to the built-in voltage Vb (about 0.7 V), the threshold voltage of the N-channel MOS transistor decreases due to a substrate bias effect. This state is assigned to logical storage data "1". As illustrated in FIG. 4AB, in a case where a memory block selected before writing is in an erase state "0" in advance, the floating voltage $V_{FB}$ of the channel region 7 is equal to $V_{ERA}$+Vb. With a write operation, a write state "1" is stored at random. As a result, logical storage data of logical "0" and that of logical "1" are created for the word line WL. As illustrated in FIG. 4AC, the level difference between the two threshold voltages of the word line WL is used to perform reading by a sense amplifier.

The magnitude relationship between the gate capacitance of the first gate conductor layer 5a and that of the second gate conductor layer 5b at the time of the read operation of the dynamic flash memory cell according to the first embodiment of the present invention and an operation related thereto will be described with reference to FIGS. 4BA to 4BC. It is desirable to design the gate capacitance of the second gate conductor layer 5b to which the word line WL is connected so as to be smaller than the gate capacitance of the first gate conductor layer 5a to which the plate line PL is connected. FIG. 4BA illustrates an equivalent circuit of one cell of the dynamic flash memory. FIG. 4BB illustrates a coupled capacitance relationship of the dynamic flash memory. Here, $C_{WL}$ denotes the capacitance of the second gate conductor layer 5b, $C_{PL}$ denotes the capacitance of the first gate conductor layer 5a, $C_{BL}$ denotes the capacitance of the PN junction between the N+ layer 3b that functions as the drain and the channel region 7, and $C_{SL}$ denotes the capacitance of the PN junction between the N+ layer 3a that functions as the source and the channel region 7. When the voltage of the word line WL changes as illustrated in FIG. 4BC, this operation affects the channel region 7 as noise. The potential change $\Delta V_{FB}$ of the channel region 7 at this time is expressed as follows.

$$\Delta V_{FB} = C_{WL}/(C_{PL}+C_{WL}+C_{BL}+C_{SL}) \times V_{ReadWL} \quad (1)$$

Here, $V_{ReadWL}$ denotes a changing potential of the word line WL at the time of reading. As apparent from expression (1), when the contribution ratio of $C_{WL}$ is made smaller relative to the total capacitance $C_{PL}+C_{WL}$ $C_{BL}$ $C_{SL}$ of the channel region 7, $\Delta V_{FB}$ decreases. Note that the conditions of voltages applied to the bit line BL, the source line SL, the word line WL, and the plate line PL and the potential of the floating body described above are examples for performing the read operation, and other operation conditions based on which the read operation can be performed may be employed.

FIGS. 5A to 5C are structural diagrams of the dynamic flash memory device according to the first embodiment. Here, the dynamic flash memory cells described with reference to FIG. 1 are disposed in two columns in plan view and in four tiers in the vertical direction. FIG. 5A is a plan view of the dynamic flash memory cells when viewed in a horizontal plane along line A-A' in FIG. 5B. FIG. 5B is a vertical cross-sectional view taken along line X-X' in FIG. 5A. FIG. 5C is a vertical cross-sectional view taken along line Y-Y' in FIG. 5A. The actual dynamic flash memory device is formed of a large number of such dynamic flash memory cells arranged in two dimensions and in a large number of tiers.

As illustrated in FIGS. 5A to 5C, on a substrate 20 (which is an example of "substrate" in the claims) and a $SiO_2$ layer 25, Si bodies 24aa (which is an example of "first semiconductor body" in the claims), 24ab (which is an example of "second semiconductor body" in the claims), 24ac, and 24ad are formed from the bottom in a first column, and Si bodies 24ba, 24bb, 24bc, and 24bd are formed from the bottom in a second column, so as to be isolated from each other in the vertical direction. On the ends of the Si bodies 24aa, 24ab, 24ac, and 24ad, N+ layers 30aa (which is an example of "first impurity region" in the claims), 30ab (which is an example of "third impurity region" in the claims), 30ac, and 30ad and N+ layers 30ba (which is an example of "second impurity region" in the claims), 30bb (which is an example of "fourth impurity region" in the claims), 30bc, and 30bd are formed respectively. On the ends of the Si bodies 24ba, 24bb, 24bc, and 24bd, N+ layers 30ca (not illustrated), 30cb (not illustrated), 30cc (not illustrated), and 30cd and N+ layers 30da (not illustrated), 30db (not illustrated), 30dc (not illustrated), and 30dd are formed respectively. To support the Si bodies 24aa to 24bd and the N+ layers 30aa to 30dd, spacer material layers 26a and 26b are formed. A $HfO_2$ layer 27a that surrounds one-side portions of the Si bodies 24aa to 24bd adjacent to the N+ layers 30aa to 30ad connected to the Si bodies 24aa to 24ad in the first column or adjacent to the N+ layers 30ca to 30cd connected to the Si bodies 24ba to 24bd in the second column, and a $HfO_2$ layer 27b that surrounds other-side portions of the Si bodies 24aa to 24bd are formed (the $HfO_2$ layers 27a and 27b are an example of "gate insulating layer" in the claims). A TiN layer 33 (which is an example of a combination of "first gate conductor layer" and "third gate conductor layer" in the claims) that surrounds the $HfO_2$ layer 27a and is formed of portions contiguous across the Si bodies 24aa to 24bd is formed. A TiN layer 34a (which is an example of "second gate conductor layer" in the claims) that surrounds the $HfO_2$ layer 27b covering the Si bodies 24aa and 24ba and is formed of contiguous portions, a TiN layer 34b (which is an example of "fourth gate conductor layer" in the claims) that surrounds the $HfO_2$ layer 27b covering the Si bodies 24ab and 24bb and is formed of contiguous portions, a TiN layer 34c that surrounds the $HfO_2$ layer 27b covering the Si bodies 24ac and 24bc and is formed of contiguous portions, and a TiN layer 34d that surrounds the $HfO_2$ layer 27b covering the Si bodies 24ad and 24bd and is formed of contiguous portions are formed. A metal electrode layer 40 that is connected to the N+ layers 30aa to 30ad and to the N+ layers 30ca to 30cd is formed. A metal electrode layer 41a that is connected to the N+ layers 30ba to 30bd and a metal electrode layer 41b that is connected to the N+ layers 30da to 30dd are formed. A $SiO_2$ layer 37a that surrounds the N+ layers 30aa to 30ad and 30ca to 30cd and a $SiO_2$ layer 37b that surrounds the N+ layers 30ba to 30bd and 30da to 30dd are formed. A $SiO_2$ layer 38 is formed so as to cover the whole.

In FIGS. 5A to 5C, the metal electrode layer 40 is connected to a source line SL. The TiN layer 33 is connected to a plate line PL. The TiN layer 34a is connected to a first word line WL1, the TiN layer 34b is connected to a second word line WL2, the TiN layer 34c is connected to a third word line WL3, and the TiN layer 34d is connected to a fourth word line WL4. The metal electrode layer 41a is connected to a first bit line BL1, and the metal electrode layer 41b is connected to a second bit line BL2. Accordingly, the dynamic flash memory device constituted by memory cells in two columns in plan view and in four tiers in the vertical direction is formed on the substrate 20.

In FIGS. 5A to 5C, a HfO$_2$ layer (not illustrated) that entirely surrounds the Si bodies 24aa to 24bd is formed. A TiN layer (not illustrated) that surrounds this HfO$_2$ layer and that has a uniform thickness is formed with, for example, the ALD (Atomic Layer Deposition) method. Portions of the HfO$_2$ layer and the TiN layer closer to the N$^+$ layers 30ba to 30bd and 30da to 30dd are removed by etching to thereby form the HfO$_2$ layer 27b and the TiN layers 34a to 34d. As illustrated in FIG. 5C, when the distance L2 between the HfO$_2$ layers 27b that are between and surround corresponding ones of the Si bodies 24aa to 24bd is made larger than two times the thickness L1 of the TiN layers 34a to 34d in the vertical direction relative to the substrate 20, the TiN layers 34a to 34d can be formed so as to be spaced apart from each other in the vertical direction relative to the substrate 20. When the distance L3 between the HfO$_2$ layers 27b that are between and surround corresponding ones of the Si bodies 24aa to 24bd is made smaller than two times the thickness L1 of the TiN layers 34a to 34d in the horizontal direction relative to the substrate 20, each of the TiN layers 34a to 34d can be formed of portions contiguous in the horizontal direction relative to the substrate 20.

Although the HfO$_2$ layers 27a and 27b are separately formed in FIGS. 5A to 5C, the HfO$_2$ layers 27a and 27b may be simultaneously formed as in FIG. 1.

Figure 6:
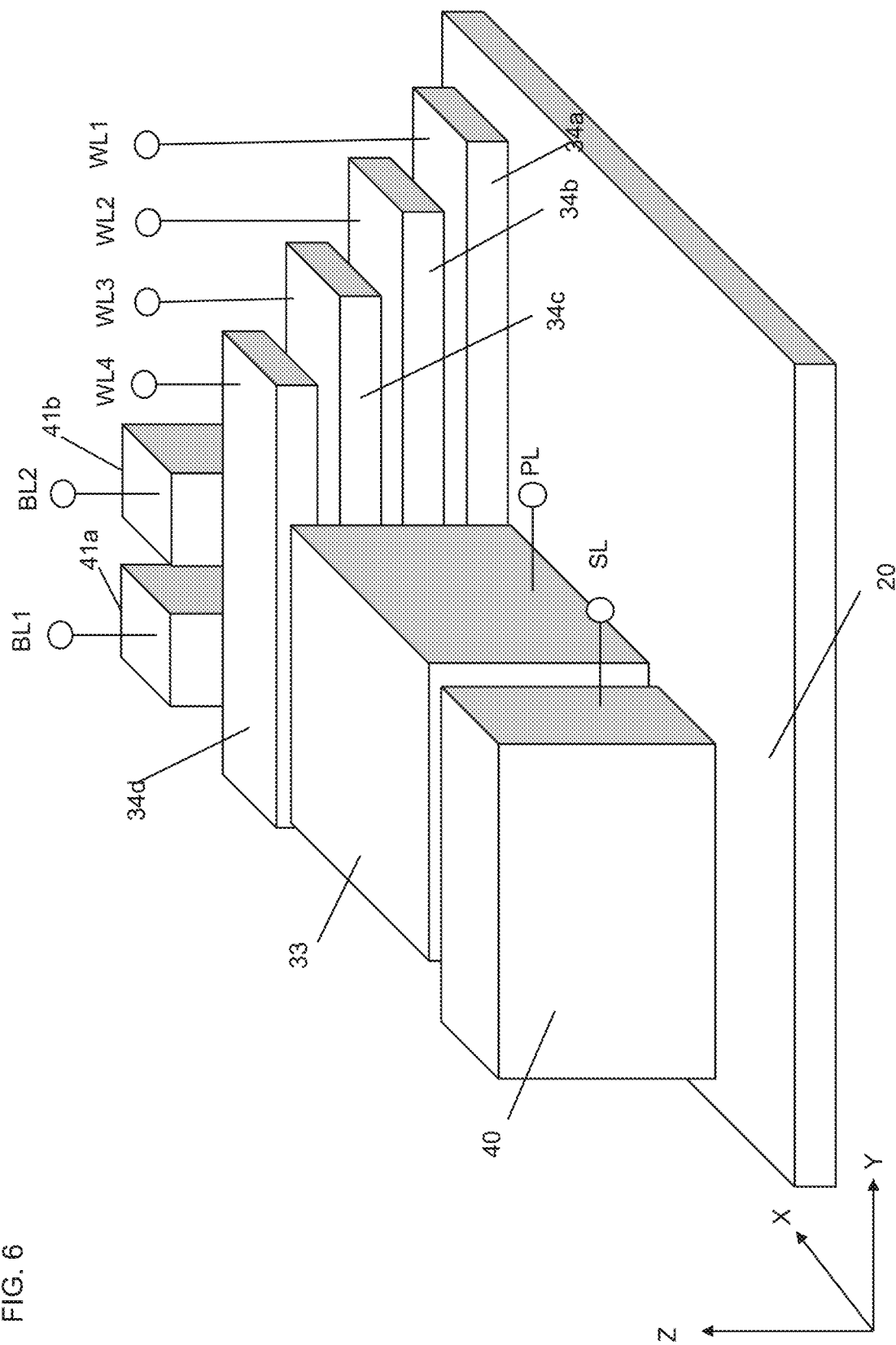
FIG. 6 is a schematic structural diagram of the SGT-including memory device according to the first embodiment.

FIG. 6 schematically illustrates the external appearance of the memory device illustrated in FIGS. 5A to 5C. In the coordinate system illustrated in FIG. 6, the X-axis direction corresponds to the X-X' direction in FIGS. 5A and 5B, the Y-axis direction corresponds to the Y-Y' direction in FIGS. 5A and 5C, and the Z-axis direction corresponds to the direction perpendicular to the substrate 20. Although not visible in FIG. 6, each of the Si bodies 24aa, 24ab, 24ac, 24ad, 24ba, 24bb, 24bc, and 24bd illustrated in FIGS. 5A to 5C is inside the TiN layer 33 and a corresponding one of the TiN layers 34a to 34d and extends in the X-axis direction. The metal electrode layer 40 connected to the N$^+$ layers 30aa, 30ab, 30ac, 30ad, 30ca, 30cb, 30cc, and 30cd illustrated in FIGS. 5A to 5C is connected to the source line SL. The TiN layer 33 that surrounds the Si bodies 24aa, 24ab, 24ac, 24ad, 24ba, 24bb, 24bc, and 24bd illustrated in FIGS. 5A to 5C and is formed of contiguous portions is connected to the plate line PL. The TiN layer 34a that surrounds the Si bodies 24aa and 24ba and is formed of contiguous portions is connected to the first word line WL1, and the TiN layer 34b that surrounds the Si bodies 24ab and 24bb and is formed of contiguous portions is connected to the second word line WL2. The TiN layer 34c that surrounds the Si bodies 24ac and 24bc and is formed of contiguous portions is connected to the third word line WL3. The TiN layer 34d that surrounds the Si bodies 24ad and 24bd and is formed of contiguous portions is connected to the fourth word line WL4. The metal electrode layer 41a connected to the N$^+$ layers 30ba to 30bd in FIGS. 5A to 5C is connected to the first bit line BL1. The metal electrode layer 41b connected to the N$^+$ layers 30da to 30dd is connected to the second bit line BL2. As illustrated in FIG. 6, the TiN layers 34a to 34d respectively connected to the word lines WL1 to WL4 extend parallel to the substrate 20. The metal electrode layers 41a and 41b respectively connected to the bit lines BL1 and BL2 are formed so as to extend in the vertical direction relative to the substrate 20. When viewed in the Z-Y plane, the TiN layers 34a to 34d are perpendicular to the metal electrode layers 41a and 41b.

As illustrated in FIG. 6, the TiN layers 34a to 34d extend in the Y direction in plan view. In the outer periphery part of the memory cell region, the TiN layers 34a to 34d are respectively connected to the word lines WL1 to WL4. In this case, the TiN layer 34a, which is disposed at the bottom, is formed such that its terminating end is outside the TiN layer 34b in the Y direction. The TiN layer 34b is formed such that its terminating end is outside the TiN layer 34c. The TiN layer 34c is formed such that its terminating end is outside the TiN layer 34d. In plan view, the word lines WL1 to WL4 respectively extending from the terminating end portions of the TiN layers 34a, 34b, 34c, and 34d in the vertical direction are connected to a metal wiring layer. Note that the TiN layers 34a to 34d can be led out to the word lines WL1 to WL4 from either end of the TiN layers 34a to 34d respectively.

Figure 7:
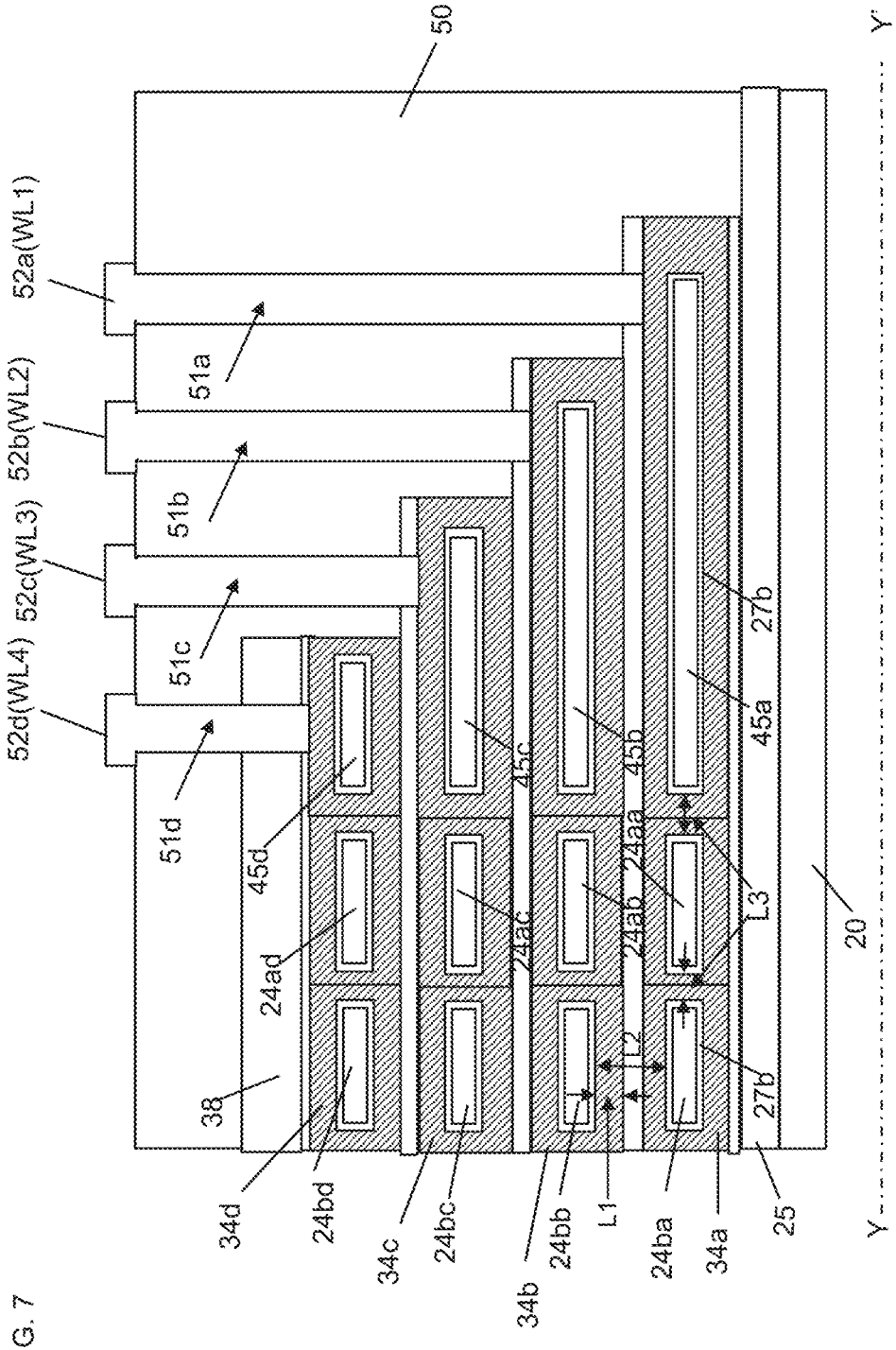
FIG. 7 is a structural diagram of the SGT-including memory device according to the first embodiment.

FIG. 7 illustrates the TiN layers 34a to 34d respectively led to the word lines WL1 to WL4 in the outer periphery part of the memory cell region. In FIG. 7, the Si bodies 24aa to 24ad and 24ba to 24bd illustrated in FIG. 5C are disposed in the terminating end part of the memory cell region. A Si body 45a (which is an example of "third semiconductor body" in the claims) is formed so as to be on a level with and adjacent to the Si bodies 24aa and 24ba. A Si body 45b (which is an example of "fourth semiconductor body" in the claims) is formed so as to be on a level with and adjacent to the Si bodies 24ab and 24bb. A Si body 45c is formed so as to be on a level with and adjacent to the Si bodies 24ac and 24bc. A Si body 45d is formed so as to be on a level with and adjacent to the Si bodies 24ad and 24bd. Around the Si bodies 45a to 45d, the HfO$_2$ layer 27b is formed as for the Si bodies 24aa to 24ad and 24ba to 24bd. The distance between the surface of the HfO$_2$ layer 27b surrounding the Si body 24aa and the surface of the HfO$_2$ layer 27b surrounding the Si body 45a is made equal to the distance L3 between the surface of the HfO$_2$ layer 27b surrounding the Si body 24aa and the surface of the HfO$_2$ layer 27b surrounding the Si body 24ba. Accordingly, the TiN layer 34a that surrounds the Si body 24aa, the Si body 24ba, and the Si body 45a and formed of contiguous portions is formed. Similarly, when the space between the Si body 24ab and the Si body 45b in the horizontal direction, the space between the Si body 24ac and the Si body 45c in the horizontal direction, and the space between the Si body 24ad and the Si body 45d in the horizontal direction are made equal to the space between the Si body 24aa and the Si body 45a in the horizontal direction, the TiN layer 34b formed of portions contiguous across the Si bodies 24ab, 24bb, and 45b in the horizontal direction, the TiN layer 34c formed of portions contiguous across the Si bodies 24ac, 24bc, and 45c in the horizontal direction, and the TiN layer 34d formed of portions contiguous across the Si bodies 24ad, 24bd, and 45d in the horizontal direction are formed.

As illustrated in FIG. 7, the TiN layer 34a, which is disposed at the bottom, is formed such that its terminating end is outside the TiN layer 34b in the horizontal direction. The TiN layer 34b is formed such that its terminating end is outside the TiN layer 34c. The TiN layer 34c is formed such that its terminating end is outside the TiN layer 34d. An insulating layer 50 is formed so as to cover the whole. A contact hole 51a (which is an example of "first contact hole" in the claims) extending from the terminating end portion of the TiN layer 34a up to a top portion of the insulating layer 50 above the terminating end portion, a contact hole 51b (which is an example of "second contact hole" in the claims) extending from the terminating end portion of the TiN layer 34b up to a top portion of the insulating layer 50 above the terminating end portion, a contact hole 51c extending from the terminating end portion of the TiN layer 34c up to a top portion of the insulating layer 50 above the terminating end portion, and a contact hole 51d extending from the terminating end portion of the TiN layer 34d up to a top portion of the insulating layer 50 above the terminating end portion are formed. A metal wiring layer 52a (which is an example of "first conductor wiring layer" in the claims) connected to the TiN layer 34a and extending to above the insulating layer 50 through the contact hole 51a, a metal wiring layer 52b (which is an example of "second conductor wiring layer" in the claims) connected to the TiN layer 34b and extending to above the insulating layer 50 through the contact hole 51b, a metal wiring layer 52c connected to the TiN layer 34c and extending to above the insulating layer 50 through the contact hole 51c, and a metal wiring layer 52d connected to the TiN layer 34d and extending to above the insulating layer 50 through the contact hole 51d are formed. The metal wiring layers 52a, 52b, 52c, and 52d are respectively connected to the word lines WL1, WL2, WL3, and WL4.

Note that each of the TiN layers 34a to 34d respectively connected to the word lines WL1 to WL4 may be divided into at least two or more TiN layers. In this case, the TiN layers obtained by dividing each of the TiN layers 34a to 34d may be disposed on the respective sides of the plate line PL as gate conductor layers. The divided TiN layers are driven synchronously or asynchronously. Similarly, the TiN layer 33 connected to the plate line PL may be divided into at least two or more TiN layers. The divided TiN layers are driven synchronously or asynchronously.

Similarly to the TiN layers 34a to 34d, in the vertical direction, the TiN layer 33 may be formed of portions contiguous in the horizontal direction and isolated in the vertical direction across the Si bodies 24aa to 24ad and 24ba to 24bd.

This embodiment has the following features.

Feature 1

Regarding the plate line PL of the dynamic flash memory cell according to the embodiment of the present invention, in the write operation and in the read operation performed by the dynamic flash memory cell, the voltage of the word line WL changes. At this time, the plate line PL assumes the role of decreasing the capacitive coupling ratio between the word line WL and the channel region 7. As a result, an effect on changes in the voltage of the channel region 7 when the voltage of the word line WL changes can be substantially suppressed. Accordingly, the difference between the threshold voltages indicating logical "0" and logical "1" can be increased. This leads to an increased operation margin of the dynamic flash memory cell.

Feature 2

As described with reference to FIGS. 5A to 5C, when the distance L2 between the HfO$_2$ layers 27b that are between and surround corresponding ones of the Si bodies 24aa to 24bd is made larger than two times the thickness L1 of the TiN layers 34a to 34d in the vertical direction relative to the substrate 20, the TiN layers 34a to 34d can be formed so as to be spaced apart from each other in the vertical direction relative to the substrate 20. When the distance L3 between the HfO$_2$ layers 27b that are between and surround corresponding ones of the Si bodies 24aa to 24bd is made smaller than two times the thickness L1 of the TiN layers 34a to 34d in the horizontal direction relative to the substrate 20, each of the TiN layers 34a to 34d can be formed of portions contiguous in the horizontal direction relative to the substrate 20. When the TiN layers 34a to 34d are formed with the ALD method that enables deposition with a uniform thickness, the TiN layers 34a to 34d that are each formed of contiguous portions and extend in the horizontal direction, that are isolated from each other in the vertical direction, and that are respectively connected to the word lines WL1 to WL4 can be easily formed. Accordingly, the production method is simplified. Further, the Si body 45a is formed such that the HfO$_2$ layer 27b of the Si body 45a is spaced apart from the HfO$_2$ layer 27b of the Si body 24aa, which is in the terminating end part that is the peripheral part of the memory cell region, by the distance L3, and the Si bodies 45b, 45c, and 45d respectively adjacent to the Si bodies 24ab, 24ac, and 24ad are similarly formed. As described with reference to FIG. 7, the TiN layer 34d, which is in the top tier, and the TiN layers 34c, 34b, and 34a disposed therebelow and the Si body 45d and the Si bodies 45c, 45b, and 45a disposed therebelow extend such that their ends are sequentially located outward and stepwise. The metal wiring layers 52a to 52d respectively extending from the terminating end portions of the TiN layers 34a to 34d to above the insulating layer 50 through the contact holes 51a to 51d extending upward in the vertical direction are formed. Accordingly, the TiN layers 34a to 34d connected to the word lines WL1 to WL4 can be easily connected by the metal wiring layers 52a to 52d. This further facilitates production.

Feature 3

As described above with reference to FIG. 6, when the source line SL is shared between dynamic flash memory cells adjacent to each other, a highly integrated dynamic flash memory is attained. When the bit line BL is shared between dynamic flash memory cells adjacent to each other, a highly integrated dynamic flash memory is attained while the number of word lines WL connected to each bit line BL is increased.

Second Embodiment

Figure 8:
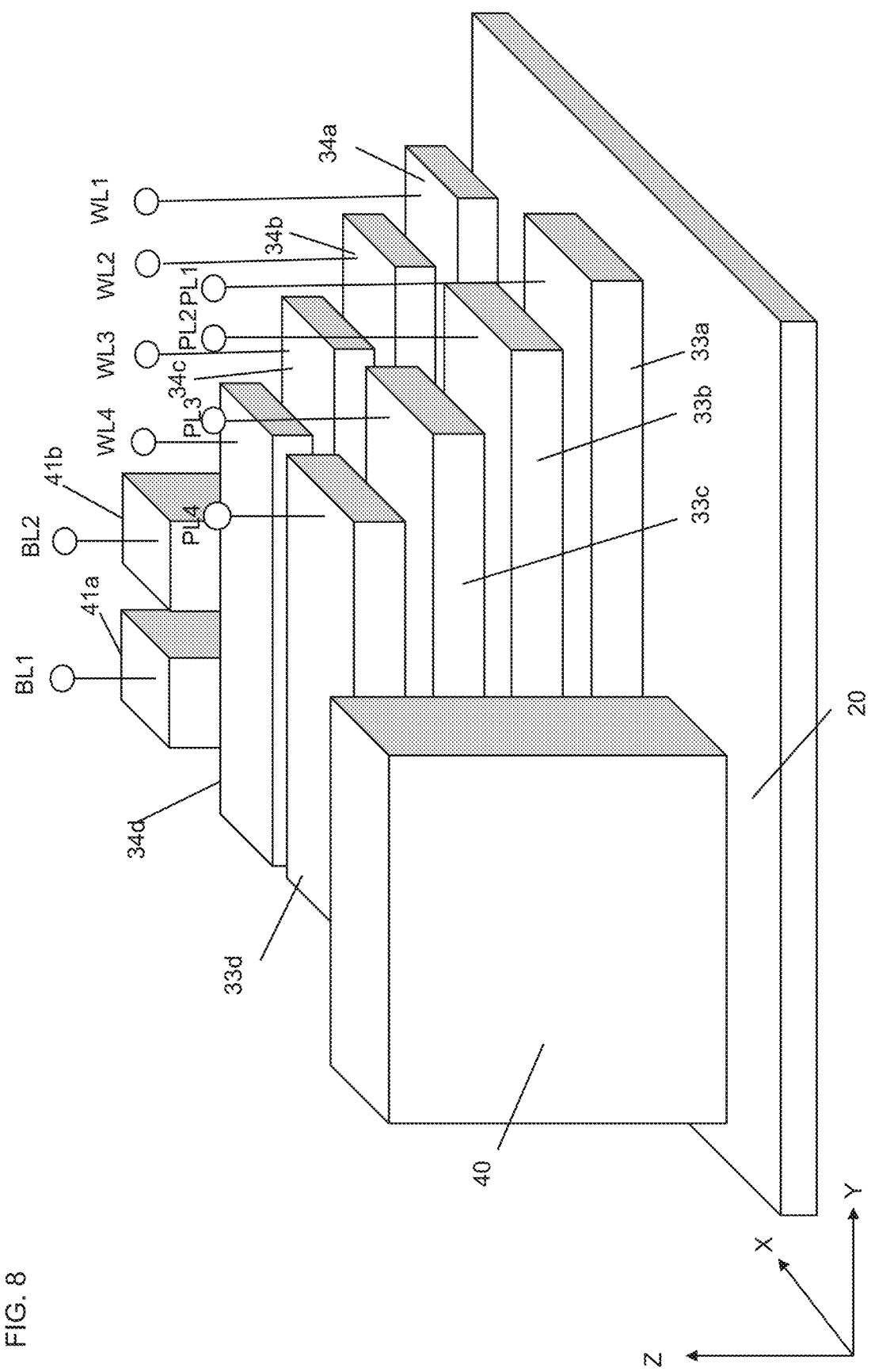
FIG. 8 is a schematic structural diagram of an SGT-including memory device according to a second embodiment.

FIG. 8 schematically illustrates the external appearance of a memory device according to a second embodiment. In FIGS. 5A to 5C, FIG. 6, and FIG. 7, the TiN layer 33 that surrounds the Si bodies 24aa, 24ab, 24ac, 24ad, 24ba, 24bb, 24bc, and 24bd and is formed of contiguous portions is formed. The TiN layer 33 is connected to the common plate line PL. In contrast, as the TiN layer 33, TiN layers 33a, 33b, 33c, and 33d that each surround corresponding ones of the Si bodies 24aa, 24ab, 24ac, 24ad, 24ba, 24bb, 24bc, and 24bd, that are isolated from each other in the vertical direction and extend in the horizontal direction, and that respectively have terminating end portions located stepwise as for the TiN layers 34a to 34d are formed. Similarly to the TiN layers 34a to 34d, via the terminating end portions of the TiN layers 33a, 33b, 33c, and 33d, the TiN layer 33a is connected to a plate line PL1, the TiN layer 33b is connected to a plate line PL2, the TiN layer 33c is connected to a plate line PL3, and the TiN layer 33d is connected to a plate line PL4. Accordingly, a dynamic flash memory in which the plate lines PL1 to PL4 can be driven independently of each other can be obtained.

Note that each of the TiN layers 33a to 33d may be divided into at least two or more TiN layers in the horizontal direction. The divided TiN layers are driven synchronously or asynchronously. Similarly, each of the TiN layers 34a to 34d may be divided into at least two or more TiN layers in the horizontal direction. The divided TiN layers are driven synchronously or asynchronously.

Third Embodiment

Figure 9:
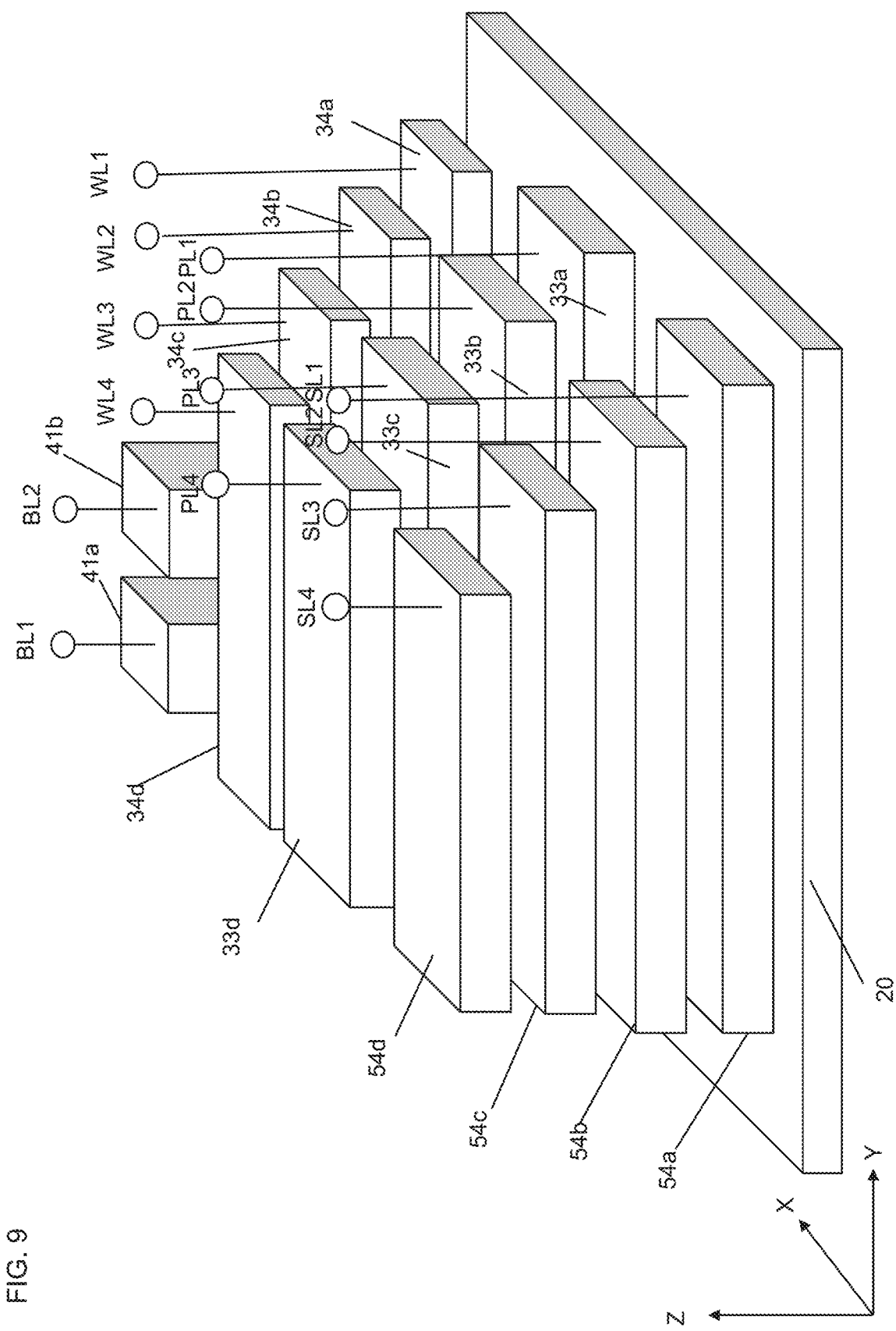
FIG. 9 is a schematic structural diagram of an SGT-including memory device according to a third embodiment.
Figure 11A:
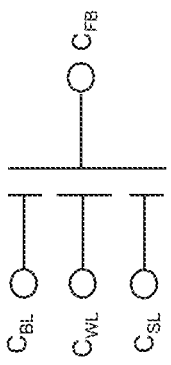
FIGS. 11A and 11B are diagrams for explaining a problem in the operation of the DRAM memory cell including no capacitor in the related art.
Figure 11B:
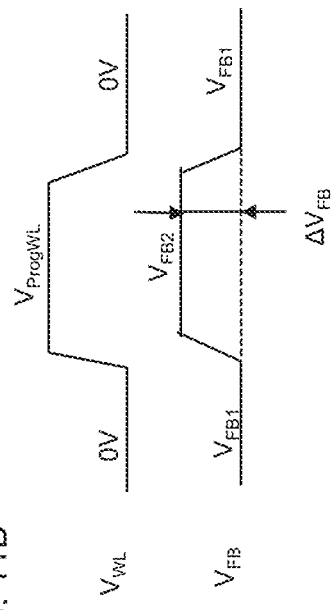
Figure 12C:
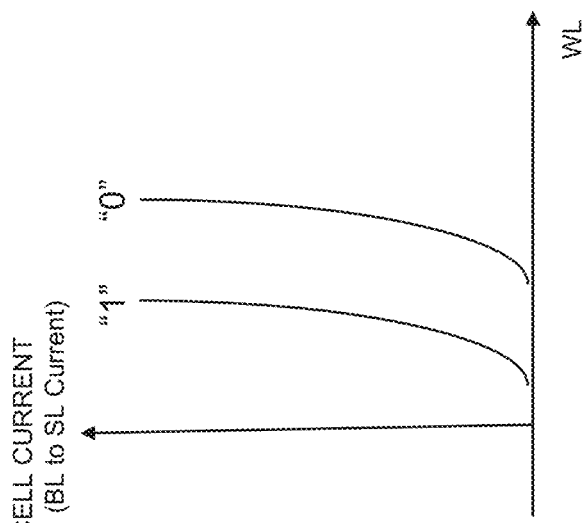
FIGS. 12A, 12B, and 12C are diagrams illustrating a read operation of the DRAM memory cell including no capacitor in the related art.
Figure 12A:
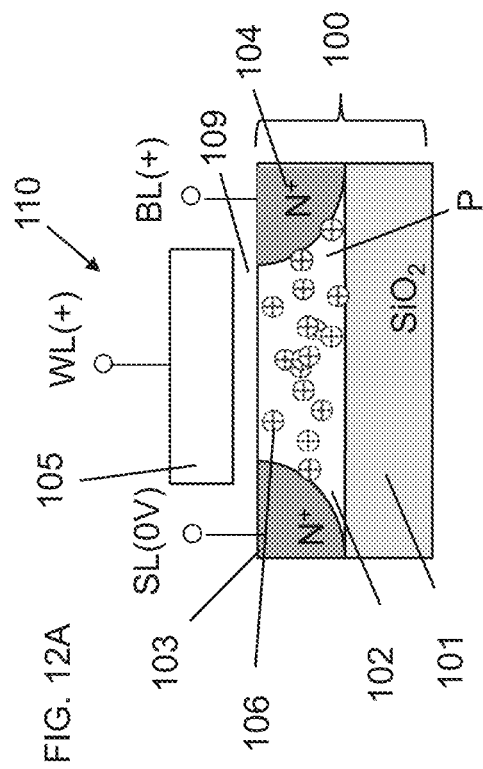
Figure 12B:
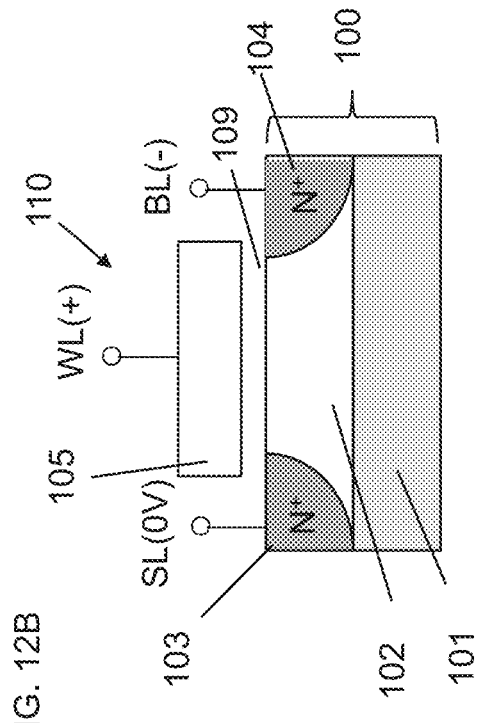

FIG. 9 schematically illustrates the external appearance of a memory device according to a third embodiment. In FIGS. 5A to 5C and FIG. 8, the N+ layers 30aa to 30ad connected to the source line SL and other N+ layers (not illustrated) also connected to the source line SL are connected to one metal electrode layer 40. In contrast, in this embodiment, metal electrode layers 54a, 54b, 54c, and 54d respectively connected to source lines SL1, SL2, SL3, and SL4 isolated from each other in the respective tiers extend parallel to the TiN layers 33a to 33d connected to the plate lines PL1 to PL4 and to the TiN layers 34a to 34d connected to the word lines WL1 to WL4 in the same direction. The wiring electrodes of the source lines SL1 to SL4 are led out from the terminating end portions of the metal electrode layers 54a to 54d formed stepwise.

Note that in FIG. 9, the TiN layers 33a to 33d isolated from each other may be formed as one TiN layer 33 as in FIG. 6. Each of the TiN layers 33a to 33d may be divided into at least two or more TiN layers in the horizontal direction. The divided TiN layers are driven synchronously or asynchronously. Each of the TiN layers 34a to 34d may be divided into at least two or more TiN layers in the horizontal direction. The divided TiN layers are driven synchronously or asynchronously.

Other Embodiments

In the first embodiment, each of the gate conductor layers 5a and 5b may be formed of a single layer or a combination of a plurality of conductor material layers. The outside of each of the gate conductor layers 5a and 5b may be connected to a wiring metal layer made of, for example, W. The same applies to other embodiments according to the present invention.

On the substrate 20, two two-column four-tier dynamic flash memory devices illustrated in FIG. 6 can be arranged in the X direction so as to share the metal electrode layer 40 connected to the source line SL of both memory devices. In this case, in plan view (X-Y plane), the source line SL is arranged in the center, and the bit lines BL1 and BL2 are arranged on both sides. Accordingly, a highly integrated dynamic flash memory is attained.

Further, two two-column four-tier dynamic flash memory devices illustrated in FIG. 6 can be arranged in the X direction so as to share the metal electrode layers 41a and 41b connected to the bit lines BL1 and BL2 of both memory devices. In this case, in plan view (X-Y plane), the bit lines BL1 and BL2 are arranged in the center, and the source line SL is arranged on both sides. Accordingly, although four word lines WL1 to WL4 are connected to each of the bit lines BL1 and BL2 in FIG. 6, the number of the connected word lines WL can be increased to eight with this arrangement. In addition, a highly integrated dynamic flash memory is attained. Note that high integration is similarly attained by connecting two or more dynamic flash memories.

Even when the first gate conductor layer 5a in FIG. 1 partially surrounds the outer periphery of the gate insulating layer 4, the operations of the dynamic flash memory can also be performed.

Even with a structure in which the conductivity type of each of the N+ layers 3a and 3b and the P-layer Si body 2 is reversed, the operations of the dynamic flash memory can be performed. In this case, in the Si body 2 that is of N-type, the majority carriers are electrons. Therefore, a group of electrons generated by impact ionization are stored in the channel region 7, and a "1" state is set.

The impurity concentration of the channel region 7 may differ in the first channel region 7a and the second channel region 7b. Further, the first channel region 7a and the second channel region 7b may be made of different semiconductor materials.

In FIG. 1, the length of the first gate conductor layer 5a, in the central-axis direction, to which the plate line PL is connected is made longer than the length of the second gate conductor layer 5b, in the central-axis direction, to which the word line WL is connected to attain $C_{PL} > C_{WL}$. However, when only the plate line PL is added, the capacitive coupling ratio ($C_{WL}/(C_{PL}+C_{WL}+C_{BL}+C_{SL})$) of the word line WL to the channel region 7 decreases. As a result, the potential change $\Delta V_{FB}$ of the floating body, namely, the channel region 7, decreases.

As the voltage of the plate line PL described in the first embodiment, a fixed voltage of, for example, 2 V may be applied regardless of the operation mode. As the voltage of the plate line PL, for example, 0 V may be applied only at the time of erasing. As the voltage of the plate line PL, a fixed voltage or a voltage changing over time may be applied as long as the voltage satisfies the conditions based on which the operations of the dynamic flash memory can be performed.

Although the vertical cross sections of the first channel region 7a and the second channel region 7b have round shapes in the first embodiment, the vertical cross sections of the first channel region 7a and the second channel region 7b may have rectangular shapes as illustrated in FIGS. 5A to 5C, elliptic shapes, or shapes elongated in one direction instead of round shapes. Also in a logic circuit region formed apart from the dynamic flash memory cell region, Si bodies having different shapes may coexist and be formed in the logic circuit region in accordance with the logic circuit design. The same applies to other embodiments according to the present invention.

Although a negative bias is applied to the source line SL at the time of the erase operation to discharge the group of positive holes in the channel region 7 that is the floating body FB as described in the first embodiment, instead of applying a negative bias to the source line SL, a negative bias may be applied to the bit line BL or a negative bias may be applied to the source line SL and to the bit line BL to perform the erase operation. The erase operation may be performed on the basis of other voltage conditions. The same applies to other embodiments according to the present invention.

In FIG. 1, an N-type or P-type impurity layer may be disposed between the N+ layer 3a and the first channel region 7a. Further, an N-type or P-type impurity layer may be disposed between the N+ layer 3b and the second channel region 7b. The same applies to other embodiments according to the present invention.

In FIG. 1, the first channel region 7a and the second channel region 7b may have different acceptor impurity concentrations. The same applies to other embodiments according to the present invention.

The N⁺ layers 3a and 3b in the first embodiment may be formed of other semiconductor material layers containing a donor impurity. The N⁺ layer 3a and the N⁺ layer 3b may be formed of different semiconductor material layers. The same applies to other embodiments according to the present invention.

In FIG. 1, the insulating layer 6 may be in contact with or may be spaced apart from the Si body 2. The same applies to other embodiments according to the present invention.

In FIGS. 5A to 5C, the TiN layer 33 may be divided into a plurality of TiN layers in the horizontal direction, and the divided TiN layers may be operated synchronously or asynchronously. The divided TiN layers may be disposed on both sides of the TiN layers 34a to 34d. The TiN layer 33 may be divided into TiN layers on respective sides of the Si bodies 24aa to 24bd in a horizontal cross section. The divided TiN layers may be operated synchronously or asynchronously. Similarly, each of the TiN layers 34a to 34d may be divided into two or more TiN layers in the horizontal direction, and the divided TiN layers may be operated synchronously or asynchronously. In these cases, the operations of the dynamic flash memory can also be performed. The same applies to other embodiments according to the present invention.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

With the semiconductor-element-including memory device according to the present invention, a high-density and high-performance dynamic flash memory is attained.

What is claimed is:

1. A semiconductor-element-including memory device comprising:
a first semiconductor body that extends parallel to and in a horizontal direction relative to a substrate;
a second semiconductor body that is spaced apart from and above the first semiconductor body in a vertical direction relative to the substrate and that overlaps the first semiconductor body in plan view;
a first impurity region and a second impurity region that are connected to respective ends of the first semiconductor body;
a third impurity region and a fourth impurity region that are connected to respective ends of the second semiconductor body;
a gate insulating layer that covers the first semiconductor body and the second semiconductor body;
a first gate conductor layer and a second gate conductor layer that surround the gate insulating layer covering the first semiconductor body and that are adjacent to each other;
a third gate conductor layer and a fourth gate conductor layer that surround the gate insulating layer covering the second semiconductor body and that respectively overlap the first gate conductor layer and the second gate conductor layer in plan view;
a third semiconductor body that is on a level with the first semiconductor body in the vertical direction, is adjacent to the first semiconductor body in the horizontal direction, is surrounded by the second gate conductor layer extending in the horizontal direction, and is disposed, in plan view, in a direction perpendicular to a direction in which the first impurity region and the second impurity region are laid;
a fourth semiconductor body that is on a level with the second semiconductor body in the vertical direction, is adjacent to the second semiconductor body in the horizontal direction, is surrounded by the fourth gate conductor layer extending in the horizontal direction, is disposed, in plan view, in a direction perpendicular to a direction in which the third impurity region and the fourth impurity region are laid, and is shorter than a length of the third semiconductor body in the horizontal direction;
a first contact hole that extends upward from a portion of the second gate conductor layer surrounding a projecting portion of the third semiconductor body, the projecting portion being located farther outward than the fourth semiconductor body in plan view;
a second contact hole that extends upward from the fourth gate conductor layer surrounding the fourth semiconductor body;
a first conductor wiring layer that extends through the first contact hole and is connected to the second gate conductor layer; and
a second conductor wiring layer that extends through the second contact hole and is connected to the fourth gate conductor layer.

2. The semiconductor-element-including memory device according to claim 1, wherein
the second gate conductor layer and the fourth gate conductor layer have identical thicknesses, and
in the vertical direction relative to the substrate, a first length equal to two times the thickness of the second gate conductor layer is shorter than a second length between the gate insulating layers covering the first semiconductor body and the second semiconductor body, and in the horizontal direction relative to the substrate, the first length is longer than a third length that is a distance between the gate insulating layers surrounding the first semiconductor body and the third semiconductor body facing each other.

3. The semiconductor-element-including memory device according to claim 1, wherein
the first gate conductor layer and the third gate conductor layer have identical thicknesses, and
in the vertical direction relative to the substrate, a first length equal to two times the thickness of the first gate conductor layer is shorter than a second length between the gate insulating layers covering the first semiconductor body and the second semiconductor body, and in the horizontal direction relative to the substrate, the first length is longer than a third length that is a distance between the gate insulating layers surrounding the first semiconductor body and the third semiconductor body facing each other.

4. The semiconductor-element-including memory device according to claim 1, wherein
the first gate conductor layer and the third gate conductor layer are contiguous in the vertical direction.

5. The semiconductor-element-including memory device according to claim 1, wherein the first gate conductor layer and the third gate conductor layer are spaced apart from each other in the vertical direction, and the semiconductor-element-including memory device further comprises:

a fifth semiconductor body that is on a level with the first semiconductor body in the vertical direction, is adjacent to the first semiconductor body in the horizontal direction, and is surrounded by the first gate conductor layer extending in the horizontal direction;

a sixth semiconductor body that is on a level with the third semiconductor body in the vertical direction, is adjacent to the third semiconductor body in the horizontal direction, is surrounded by the third gate conductor layer extending in the horizontal direction, and is shorter than a length of the fifth semiconductor body in the horizontal direction;

a third contact hole that extends upward from a portion of the first gate conductor layer surrounding a projecting portion of the fifth semiconductor body, the projecting portion being located farther outward than the sixth semiconductor body in plan view;

a fourth contact hole that extends upward from the third gate conductor layer surrounding the sixth semiconductor body;

a third conductor wiring layer that extends through the third contact hole and is connected to the first gate conductor layer; and a fourth conductor wiring layer that extends through the fourth contact hole and is connected to the third gate conductor layer.

6. The semiconductor-element-including memory device according to claim 1, wherein the first impurity region and the third impurity region are electrically connected to each other, and the second impurity region and the fourth impurity region are electrically connected to each other.

7. The semiconductor-element-including memory device according to claim 1, wherein the first impurity region and the third impurity region are electrically isolated from each other, and the second impurity region and the fourth impurity region are electrically connected to each other.

8. The semiconductor-element-including memory device according to claim 1, comprising:

a first memory cell that is formed of the first impurity region, the second impurity region, the first semiconductor body, the gate insulating layer, the first gate conductor layer, and the second gate conductor layer;

a second memory cell that has a structure identical to a structure of the first memory cell, is disposed in a direction in which the first impurity region and the second impurity region are laid, and is adjacent to the first impurity region, the first impurity region functioning as an impurity layer connected to a source line of the second memory cell; and a third memory cell that has a structure identical to the structure of the first memory cell, is disposed in the direction in which the first impurity region and the second impurity region are laid, and is adjacent to the second impurity region, the second impurity region functioning as an impurity layer connected to a bit line of the third memory cell.

9. The semiconductor-element-including memory device according to claim 1, wherein voltages applied to the first impurity region, the second impurity region, the third impurity region, the fourth impurity region, the first gate conductor layer, the second gate conductor layer, the third gate conductor layer, and the fourth gate length are controlled to perform a memory write operation in which, of a group of electrons and a group of positive holes generated by an impact ionization phenomenon caused by a current that flows through the first semiconductor body and the second semiconductor body or by a gate-induced drain leakage current, the group of electrons or the group of positive holes that are majority carriers are retained in the first semiconductor body and the second semiconductor body, and perform a memory erase operation in which the group of electrons or the group of positive holes that are majority carriers are discharged from the first semiconductor body and the second semiconductor body.

10. The semiconductor-element-including memory device according to claim 1, wherein each of the first gate conductor layer and the third gate conductor layer is divided into a plurality of gate conductor layers, in the horizontal direction, having identical shapes in plan view, and the divided gate conductor layers are driven synchronously or asynchronously.

11. The semiconductor-element-including memory device according to claim 1, wherein each of the second gate conductor layer and the fourth gate conductor layer is divided into a plurality of gate conductor layers, in the horizontal direction, having identical shapes in plan view, and the divided gate conductor layers are driven synchronously or asynchronously.

12. The semiconductor-element-including memory device according to claim 1, wherein the first gate conductor layer and the third gate conductor layer are separately disposed on respective side surfaces of the first semiconductor body and are driven synchronously or asynchronously.

13. The semiconductor-element-including memory device according to claim 1, wherein the second gate conductor layer and the fourth gate conductor layer are separately disposed on respective side surfaces of the first semiconductor body and are driven synchronously or asynchronously.

* * * * *